United States Patent
McIntosh et al.

(10) Patent No.: US 10,636,929 B2
(45) Date of Patent: Apr. 28, 2020

(54) CROSS-TALK SUPPRESSION IN GEIGER-MODE AVALANCHE PHOTODIODES

(75) Inventors: K. Alexander McIntosh, Groton, MA (US); David C. Chapman, Albuquerque, NM (US); Joseph P. Donnelly, Carlisle, MA (US); Douglas C. Oakley, Natick, MA (US); Antonio Napoleone, Watertown, MA (US); Erik K. Duerr, Groton, MA (US); Simon Verghese, Arlington, MA (US); Richard D. Younger, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/771,155

(22) Filed: Apr. 30, 2010

(65) Prior Publication Data

US 2011/0169117 A1    Jul. 14, 2011

Related U.S. Application Data

(60) Provisional application No. 61/214,934, filed on Apr. 30, 2009.

(51) Int. Cl.
*H01L 31/107* (2006.01)
*H01L 27/144* (2006.01)
(Continued)

(52) U.S. Cl.
CPC .......... *H01L 31/107* (2013.01); *H01L 25/167* (2013.01); *H01L 27/1446* (2013.01);
(Continued)

(58) Field of Classification Search
CPC ...................................................... H01L 31/107
(Continued)

(56) References Cited

U.S. PATENT DOCUMENTS

| 7,667,400 B1 * | 2/2010 | Goushcha ........... H01L 27/1446 313/523 |
| 2003/0116818 A1 | 6/2003 | Kuhara et al. |

(Continued)

FOREIGN PATENT DOCUMENTS

| JP | 03022394 A * | 1/1991 | ............. H05B 33/26 |

OTHER PUBLICATIONS

Mathewson et al., "Photon Counting Arrays for Spatially Varying, Low Light Level Signals," SPIE vol. 2022: "Photodetectors and Power Meters," pp. 132-143, Oct. 1993.

(Continued)

*Primary Examiner* — Hsin Yi Hsieh
(74) *Attorney, Agent, or Firm* — Theresa Lober

(57) ABSTRACT

An avalanche photodiode detector is provided with a substrate including an array of avalanche photodiodes. An optical interface surface of the substrate is arranged for accepting external input radiation. There is provided at least one cross-talk blocking layer of material including apertures positioned to allow external input radiation to reach photodiodes and including material regions positioned for attenuating radiation in the substrate that is produced by photodiodes in the array. Alternatively at least one cross-talk blocking layer of material is disposed on the optical interface surface of the substrate to allow external input radiation to reach photodiodes and attenuate radiation in the substrate that is produced by photodiodes in the array. At least one cross-talk filter layer of material can be disposed in the substrate adjacent to the photodiode structures, including a (Continued)

material that absorbs radiation in the substrate that is produced by photodiodes in the array.

11 Claims, 15 Drawing Sheets

(51) Int. Cl.
    *H01L 31/0216*     (2014.01)
    *H01L 25/16*     (2006.01)
    *H01L 31/02*     (2006.01)
    *H01L 31/0232*     (2014.01)
    *H01L 31/0304*     (2006.01)
    *H01L 31/0352*     (2006.01)

(52) U.S. Cl.
    CPC .. *H01L 31/02005* (2013.01); *H01L 31/02162* (2013.01); *H01L 31/02327* (2013.01); *H01L 31/03046* (2013.01); *H01L 31/0352* (2013.01); *H01L 2924/0002* (2013.01)

(58) Field of Classification Search
    USPC .......................... 257/186, E31.063, E31.064
    See application file for complete search history.

(56) References Cited

U.S. PATENT DOCUMENTS

| | | |
|---|---|---|
| 2003/0213895 A1 | 11/2003 | Duer |
| 2006/0157806 A1* | 7/2006 | Rhodes ............. H01L 27/14609 257/414 |
| 2008/0121866 A1 | 5/2008 | Yuan et al. |
| 2008/0308738 A1 | 12/2008 | Li et al. |
| 2009/0008738 A1 | 1/2009 | Yuan et al. |
| 2010/0053594 A1* | 3/2010 | Yuan et al. .................. 356/5.01 |

OTHER PUBLICATIONS

Iguchi et al., "Novel Rear-Illuminated 1.55 micron-Photodiode With High Wavelength Selectivity Designed for Bi-Directional Optical Transceiver," 2000 IEEE Conf. on Indium Phosphide and Related Materials, Conf. Proc. pp. 317-320, May 2000.

Nakanishi et al., "Design and Characterization of 1.3/1.55 micron Optical Transceiver Using STraight Waveguide and Double-Filter Photodiode," Electronics and Comms. in Japan, Part 2, vol. 85, No. 8, pp. 25-33, Translated from vol. 184-C, No. 9, pp. 831-838, Sep. 2001.

Jackson et al., "Toward integrated single-photon-counting microarrays," Opt. Eng., vol. 42, No. 1, pp. 112-118, Jan. 2003.

Rech et al., "In-depth Analysis of Optical Crosstalk in Single-Photon Avalanche Diode Arrays," Proc. of the SPIE, Advanced Photon Counting Techniques II, vol. 6771, pp. 677111-1-677111-10, Oct. 2007.

Verghese et al., "Arrays of InP-based Avalanche Photodiodes for Photon Counting," IEEE Jnl. of Selected Topics in Quantum Electronics, vol. 13, No. 4, pp. 870-886, Jul. 2007.

Sciacca et al., "Crosstalk Characterization in Geiger-Mode Avalanche Photodiode Arrays," IEEE Elec. Device Letts., vol. 29, No. 3, pp. 218-220, Mar. 2008.

Kindt, "Geiger Mode Avalanche Photodiode Arrays," Thesis, Delft Technical University, pp. 84-95, 116-117, 150-153, 176-181, Mar. 1999.

Donnelly et al., "Design Considerations for 1.06 micron InGaAsP—InP Geiger-Mode Avalanche Photodiodes," IEEE Jnl. Quantum Electronics, vol. 42, No. 8, pp. 797-809, Aug. 2006.

Itzler et al., "InP-based Geiger-mode avalanche photodiode arrays for three-dimensional imaging at 1.06 micron," SPIE Conf.: "Advanced Photo Counting Techniques III," SPIE vol. 7320, pp. 73200O-1-73200O-12 , Apr. 2009.

McIntosh, "Geiger-Mode Avalanche Photodiode Arrays for Near-Infrared Single Photon Detection," Conference on Lasers and Electro Optics, San Jose, CA, Presentation slides 1-29, May 7, 2008.

Otte, On the efficiency of photon emission during electrical breakdown in silicon, Nuclear Instruments and Methods in Phys. Research A, vol. 610, pp. 105-109, May 2009.

Younger et al., "Crosstalk Analysis of Integrated Geiger-mode Avalanche Photodiode Focal Plane Arrays," SPIE Conf.: "Advanced Photon Counting Techniques III," SPIE vol. 7320, pp. 73200Q-1-73200Q-12 , Apr. 15, 2009.

Younger et al., "Crosstalk Analysis of Integrated Geiger-mode Avalanche Photodiode Focal Plane Arrays," SPIE Conf.: "Advanced Photon Counting Techniques III," Presentation slides 1-18, Apr. 15, 2009.

Patent Abstracts of Japan, Publication No. 2005108955 A, "Semiconductor Device, Manufacturing Method Thereof, and Optical Communication Module," p. 1 of 1, Apr. 21, 2005.

\* cited by examiner

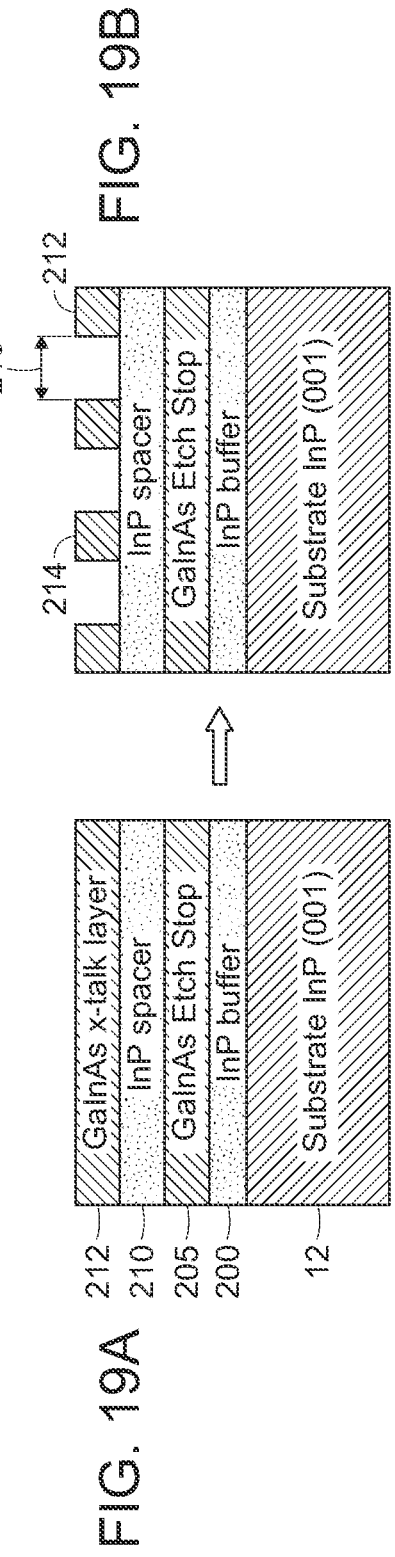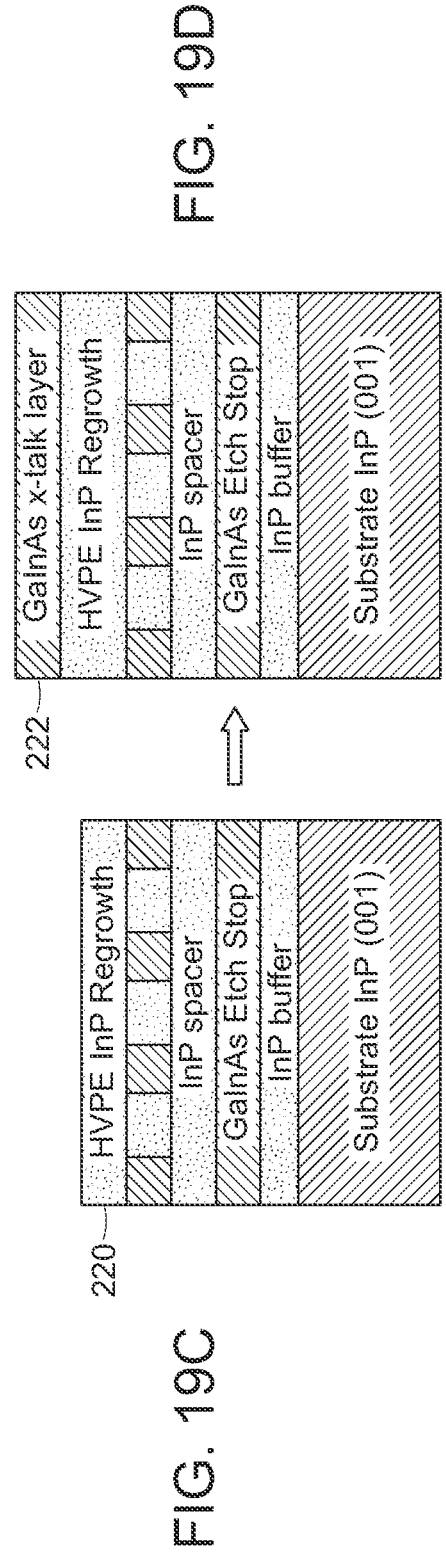

CROSS-TALK SUPPRESSION IN GEIGER-MODE AVALANCHE PHOTODIODES

CROSS-REFERENCE TO RELATED APPLICATION

This application claims the benefit of U.S. Provisional Application No. 61/214,934, filed Apr. 30, 2009, the entirety of which is hereby incorporated by reference.

STATEMENT REGARDING FEDERALLY SPONSORED RESEARCH

This invention was made with Government support under Contract No. FA8721-05-C-0002 awarded by the Department of Defense. The Government has certain rights in the invention.

BACKGROUND OF INVENTION

This invention relates generally to electronic photodiodes, and more particularly relates to avalanche photodiodes such as Geiger-mode avalanche photodiodes.

Avalanche photodiodes (APDs) operating in Geiger-mode (GM) can be employed to detect single infrared photon arrival with sub-nanosecond accuracy. As a result, Geiger-mode avalanche photodiode arrays are receiving increased interest for a number of photon-counting applications, including astronomy, three-dimensional laser radar (LADAR), and photon-counting based optical communication.

In Geiger-mode operation, an avalanche photodiode is biased above its characteristic breakdown voltage. This is a metastable state because the generation of an electron-hole charge pair in the photodiode, either thermally or through absorption of a photon, can cause the photodiode to break down. For example, upon absorption of a photon at a thusly biased photodiode, breakdown produces a rapid rise in current, which ultimately becomes limited by series resistance and internal space-charge effects. Because an avalanche photodiode when operated in Geiger mode is initially biased a few volts above breakdown, the breakdown event caused by photon absorption produces a large voltage signal swing that is sufficient for directly driving CMOS digital logic.

This is an important attribute of Geiger-mode APDs and has allowed the development of Geiger-mode arrays bonded directly to readout integrated circuits (ROICs) and micro-optics to form focal plane arrays for use in imaging or other applications. The ability to produce arrays of photodiodes and read them out at high data rates is important for both LADAR and optical-communications applications. The use of an all-digital readout reduces power, and makes the APD technology more easily scalable to large array sizes than competing technologies employing, e.g., linear-mode APDs or photomultiplier tubes.

One limitation of such densely packed Geiger-mode APDs arrays is optical cross-talk. When operated in or near Geiger-mode, avalanche photodiodes generate many highly energetic electron/hole charge carrier pairs. Some of these charge carriers lose energy by emitting within the photodiode itself a spectrum of photons, which can be detected at other nearby photodiodes in an array of photodiodes. Such detection of photons that are secondary, i.e., produced at and coming from a neighboring photodiode rather than from a source external to the photodiode array, cause corresponding secondary detection events across the photodiode array. Cross-talk is the term used herein to describe this process of secondary photon detection across an APD array. As Geiger-mode APD array size, density, and performance requirements increase, optical cross-talk becomes an increasingly limiting source of such secondary photon detection.

SUMMARY OF THE INVENTION

The invention provides photodiode detector designs, and processes for fabricating such designs, that substantially suppress cross-talk effects in an array of avalanche photodiodes. In one example there is provided an avalanche photodiode detector with a substrate including an array of avalanche photodiodes. An optical interface surface of the substrate is arranged for accepting external input radiation. In one example, there is provided at least one cross-talk blocking layer of material that includes apertures positioned to allow external input radiation to reach photodiodes and that includes material regions positioned for attenuating radiation in the substrate that is produced by photodiodes in the array. In a further example, there is provided at least one cross-talk blocking layer of material, disposed on the optical interface surface of the substrate, that allows external input radiation to reach photodiodes and that attenuates radiation in the substrate that is produced by photodiodes in the array. In a further example, at least one cross-talk filter layer of material is disposed in the substrate adjacent to the photodiode structures. This cross-talk filter layer includes a material that absorbs radiation in the substrate that is produced by photodiodes in the array.

With these configurations, the photodiode detector designs of the invention enable highly efficient photon detection that is increasingly required for modern astronomy, three-dimensional laser radar (LADAR), and photon-counting based optical communications. Other features and advantages of the invention will be apparent from the following description and accompanying figures, and from the claims.

BRIEF DESCRIPTION OF THE DRAWINGS

FIGS. 19A-19H are schematic sideviews of an APD detector array substrate and sacrificial platform as bulk cross-talk blocking layers, APD layers, and a microlens array are fabricated.

DETAILED DESCRIPTION OF THE INVENTION

Figure 1:
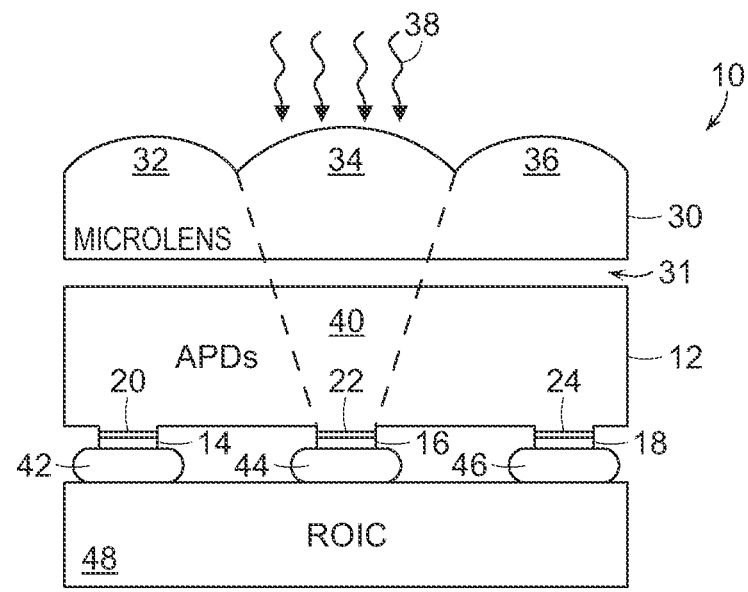
FIG. 1 is a schematic cross-sectional sideview of a portion of an APD detector array stack.

Referring to FIG. 1, there is schematically shown a region of a focal plane array 10 of an avalanche photodiode detector, in sectional sideview. The array is provided in this example as a stack of three components including a substrate 12 that supports an array of avalanche photodiodes (APDs) such as the three example photodiodes 14, 16, 18 shown in the figure. Each photodiode is in this example configuration formed as a structure of photodiode layers, e.g., as an inverted mesa structure, and can include, e.g., an absorber layer, a grading layer, a field-stop, or charge, layer, and an avalanche, or multiplier, layer, identified together schematically in the figure as 20, 22, 24, for the photodiodes 14, 16, 18, and described in detail below. An avalanche photodiode structure of this configuration is commonly referred to as a SAM or SAGCM structure.

The APD detector focal plane array stack includes a microlens array 30 that is positioned adjacent to the APD detector array substrate 12 and can be separated from the substrate by an air gap 31 as described in detail below. The microlens array focuses incoming light 38, i.e., photons, and directs the cone 40 of focused light to a corresponding photodiode 22. The extent of the gap 31 is accordingly set to optimize the coupling of light from the lenses 32, 34, 36 to the APDs by matching the lens focal length to the thickness of the focal plane array stack. Without a microlens, each photodiode could be sensitive to external light incoming to the array from any angle; the microlens array excludes such background optical input from the APD array. In addition, by focusing incoming light, the microlens array enables a reduction in the required photodiode size, thereby increasing the radiation hardness and reducing the dark count rate and optical cross-talk of the array.

The focal plane array further includes a semiconductor platform, such as a microchip, that provides a circuitry such as a photodiode read out integrated circuit (ROIC) 48, that is connected to the APD array to produce electrical signals indicative of photon arrival time stamps, and/or other information, for each photodiode in the array. Bump bonds 42, 44, 46, or other suitable connection technologies as are known in the art, are provided to connect the photodiodes of the array to the circuitry of the ROIC 48. Not shown in the figure is packaging of the focal plane array stack and stack cooling devices provided, as are commonly employed, for cooling the stack during operation.

Figure 2:
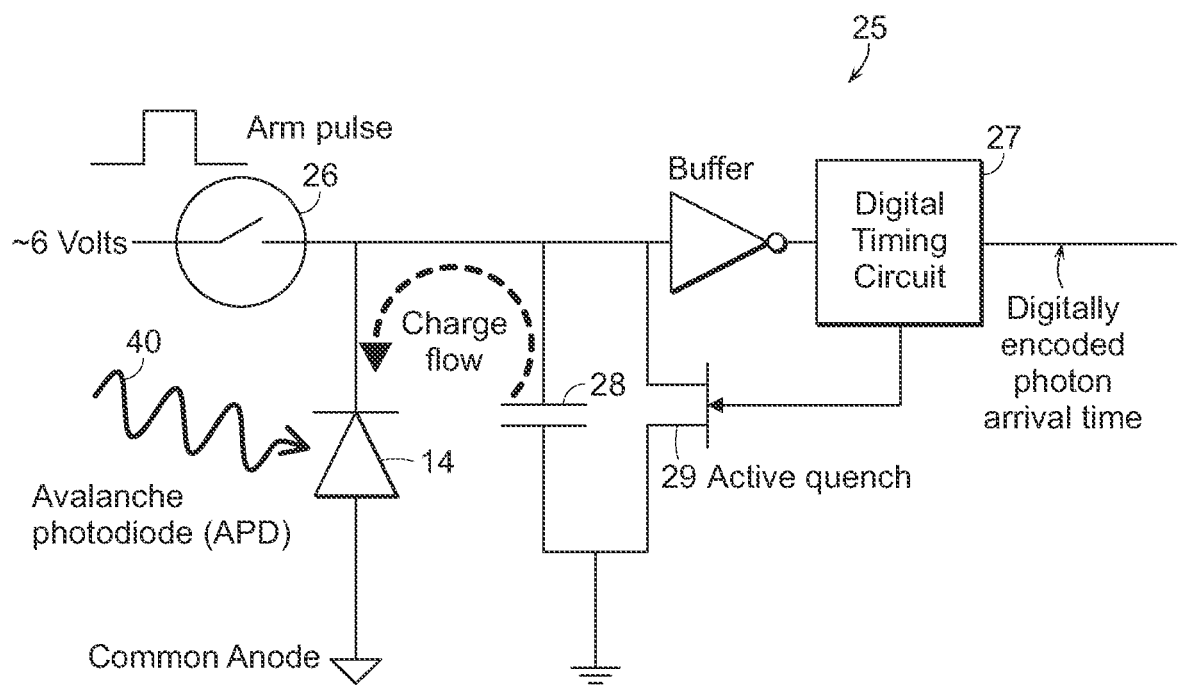
FIG. 2 is a schematic diagram of a control circuit for arming, quenching, and digitally encoding photon arrival times for the APD detector array stack of FIG. 1.

Referring also to FIG. 2, in operation of the APDs of the focal plane array detector as Geiger-mode avalanche photodiodes, each photodiode 14 is separately armed by an arming circuit 25, at a bias above the breakdown voltage for detecting an incoming photon 40, by an arm pulse 26. When an incoming photon 40 is directed to a photodiode 14 of the array and an avalanche breakdown event occurs, an arming capacitor 28 discharges through current limiting resistance of the photodiode. At some point during the avalanche breakdown event, depletion of the available charge restricts the APD discharge, which follows an exponential decay, until the digital timing logic 27 registers the avalanche event as detection of an incoming photon and engages an active quench controller 29, if such is desired for a given application, to quench the event.

In one example configuration for registering avalanche events, the digital timing logic 27 times photon arrivals at each photodiode into discrete time bins, so that the position and time of each detection event across the APD array can be indicated. The ROIC 48 can be configured to correspondingly operate in a framed mode for the photodiode bins, whereby the entire photodiode array is armed together, allowed to observe for a time, and then disarmed, with each photodiode time bin then digitally read out to a buffer, and then all photodiodes re-armed together. With this arrangement, once a photodiode commences an avalanche event due to an incoming photon, that photodiode cannot register a second avalanche event within the remaining duration of a frame and is insensitive to any further arriving photons. This example APD array control can be particular advantageous for many photon counting applications, but is not in general required by the invention. Any suitable APD array control technique can be employed for setting the bias and sensing the avalanche events of photodiodes in the detection of incoming photons.

Figure 3:
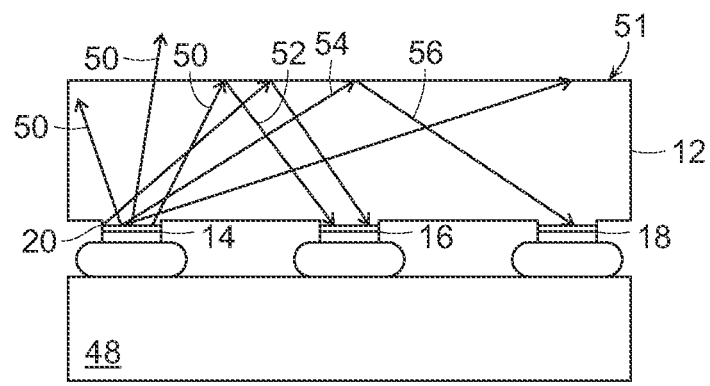
FIG. 3 is a schematic cross-sectional sideview of the APD detector array substrate of FIG. 1, here showing the optical path of cross-talk photons generated by an avalanche event at a first photodiode.

Whatever photodiode control methodology is employed, when a photon incoming to the APD array reaches a photodiode and causes an avalanche event at that photodiode, broad spectrum secondary light is produced by the photodiode in the photodiode multiplication layer during the avalanche process. Referring to FIG. 3, this secondary light 50 propagates outward from the photodiode 14 at which the light was produced, back through the APD array substrate 12. Any of this secondary light that is directed through the substrate toward the back surface 51 of the substrate can reflect off of that back surface and propagate back into the substrate 12 at a corresponding reflection angle.

Depending on the geometry of the APD array, the size and spacing of each photodiode active area in the array, and the thickness of the APD array substrate, secondary light 52, 54, 56 that reflects off of the back surface of the substrate may be directed to photodiodes 16, 18 in the neighborhood of the photodiode 14 at which they originated. This secondary light in turn may cause avalanche events at the neighboring photodiodes at which they arrive, if the neighboring photodiodes are armed for photon detection, triggering such neighboring photodiodes to generate spurious photon count signals that are indicative of secondary photon detection rather than primary external photon detection.

Figure 4C:
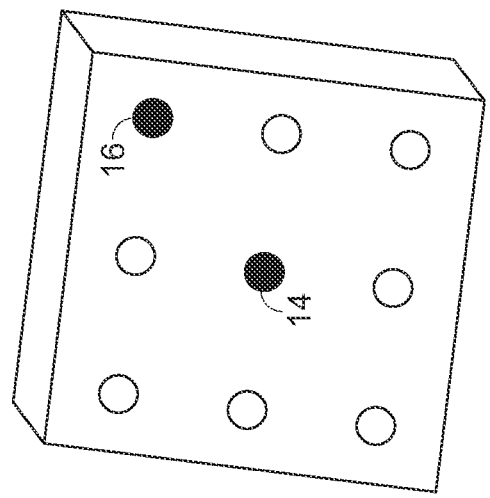
FIGS. 4A-4C are schematic views of selected photon paths taken from FIG. 3.
Figure 4B:
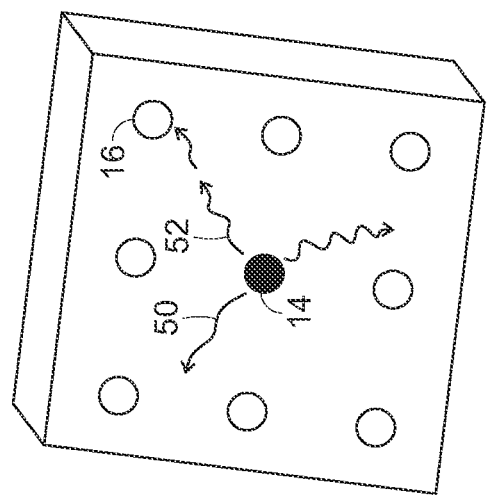
Figure 4A:
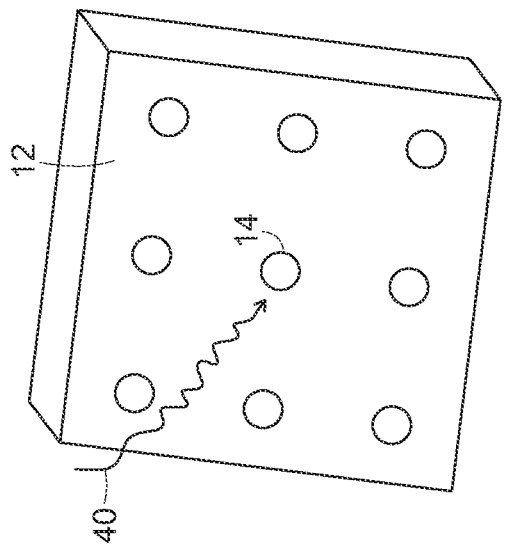

Referring also to FIGS. 4A-4C, this process is shown in another view of the APD array, with an incoming photon 40 directed at a first photodiode 14, causing that photodiode 14 to trigger a detection signal and produce secondary photons 50, one of which 52 is directed to a neighboring photodiode 16. As a result, avalanche triggering of both the neighboring photodiode 16 as well as the primary photodiode 14 occurs. This avalanche triggering of photodiodes by secondary photons that are emitted by a neighboring photodiode during a primary avalanche event is referred to as optical coupling or optical cross-talk.

As mentioned above, the degree of optical coupling between photodiodes in an array depends on the geometry of the array, the size and spacing of the active area of each photodiode, and the thickness of the APD array substrate. An additional factor is the angle of total internal reflection that is characteristic for the interface at the front optical interface, or back side 51, of the APD array substrate 12, given the material of the substrate and the presence of a lower dielectric gap between the APD array substrate and the microlens. For example, given an APD array substrate of InP and the inclusion of an air gap between the substrate and the microlens, the characteristic angle of total internal reflection is 17.7°. This relatively small angle for total internal reflection strongly increases the optical coupling efficiency for next-nearest-neighbor and farther photodiodes in the APD array. Optical analysis, e.g., employing optical design software, can be conducted to calculate the precise optical coupling for all photodiodes in an array.

In one technique in accordance with the invention for reducing such optical coupling, spatial elements, i.e., physical structural elements, are incorporated into the APD array and/or photodiode structure to manipulate the optical path between photodiodes in the array. In one example of this technique, one or more characteristics of interfaces of the APD array substrate, e.g., the front optical interface that is in the example here the back side surface 51, of the APD substrate 12, are controlled to at least partially suppress internal reflection of secondary photons that are produced and directed to those substrate interface surfaces as the result of a primary avalanche event at a photodiode in the array.

Figure 5:
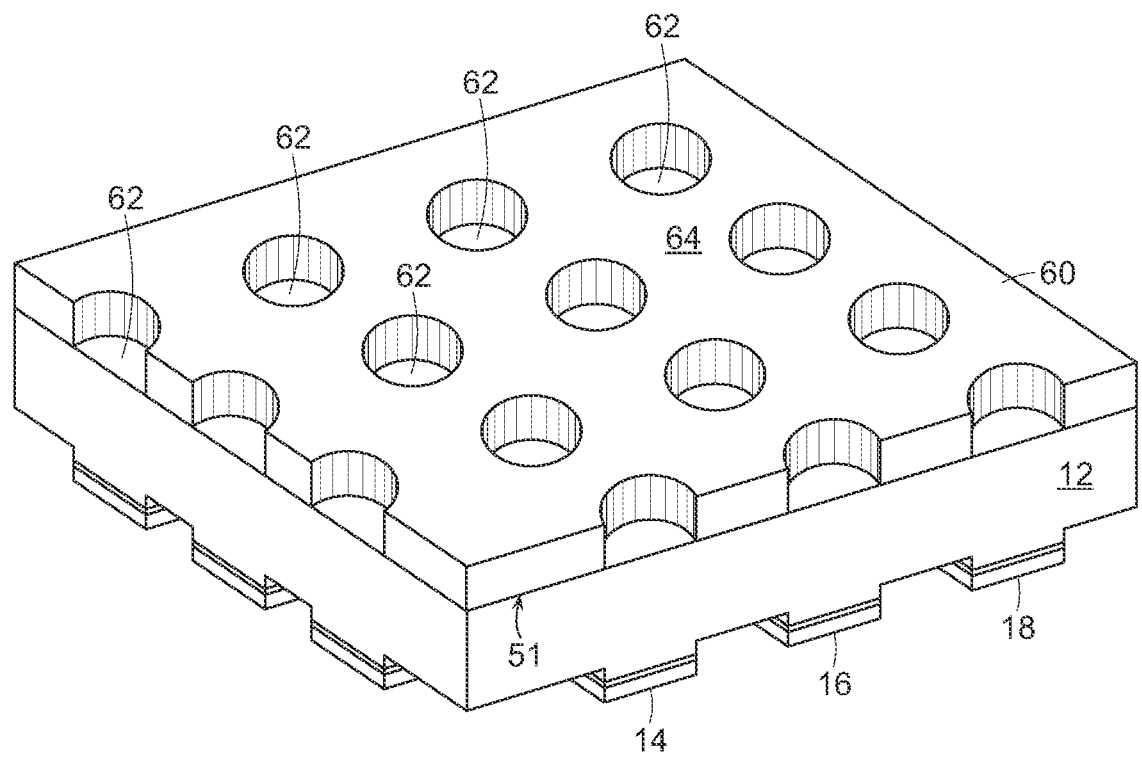
FIG. 5 is a schematic perspective view of an APD detector array substrate including a back side cross-talk blocking layer for attenuating optical cross-talk in the substrate.

Referring to FIG. 5, there is shown one example configuration of such, here provided as one or more layers 60 of material disposed on the front optical surface 51 of the APD array substrate 12, which is the back side of the substrate, in a pattern that includes open, exposed surface regions 62 for accepting input radiation at each photodiode such as 14, 16, 18 and that includes surface regions 64 which cover the substrate 12 with the material. The microlens array 30 is not shown in this view for clarity; it is to be understood that the microlens array is positioned atop the layers 60, either spaced-apart or adjacent to the layers in the manner described below.

The blanket-coating surface regions 64 of the layer 60 at least partially suppress internal reflection of secondary radiation that is emitted due to recombination or relaxation of charges in each photodiode structure during an avalanche event, while the apertures 62 are provided with appropriate geometry and spacing to allow efficient transmission of primary photons within the input beam path through the microlens array to photodiodes in the APD array.

In one configuration, the one or more layers 60 are at least partially absorbing media selected to reduce the contribution of secondary interface reflections in the APD array substrate. Examples of such absorbing media are semiconductors, metals, dielectrics, polymers, molecular or atomic species, quantum wells, photonic crystals, and other suitable media. The layer 60 can include any number of materials or surface properties provided in any arrangement that results in a desired surface characteristic. For example, anti-reflection coatings and/or similar suitable anti-reflection surface treatments can be provided on regions of the APD array substrate back surface that are outside the optical path of primary photons.

For a material layer to be provided on the back surface, appropriate selection of the materials to be included in the layer 60 for a given APD array in general requires determination of the absorption strength of the media for the layer thicknesses that can be accommodated by the APD array configuration as well as fabrication process. Operation of the back side absorber media layer 60 is required at both below and above the critical angle for total internal reflection inside the APD array substrate, and thus attention is preferably also given to the angular and polarization dependence of absorption of the media. It is found that evanescent coupling strength of the absorber media layer 60 can be, in general, different than travelling wave attenuation by the media layer 60 and that such evanescent coupling dominates attenuation of reflection between photodiodes. Thus, depending on the spectral width and originating location of cross-talk photons, various different absorbing media can be utilized singly as the back side layer 60 or in combination as a stack of layers.

The material layer 60 can be any suitable material or combination of materials that in some way disrupts reflection of radiation from the material, e.g., by attenuating radiation impinging the material. For example, a lossy material can be employed, such as titanium, germanium, and combinations of such with, e.g., gold and chromium or other suitable material. But as explained above, the material can be provided as an organic as well as inorganic material, and as a semiconductor, a metal, or an insulator. Any material that is a high-efficiency absorber but a poor radiator at the photodiode wavelength of interest, as the material relaxes after radiation absorption, can be a particularly good selection. Where a semiconductor material is employed, in one example the semiconductor is provided as an indirect-bandgap semiconductor that does not radioactively recombine when the semiconductor absorbs light at the wavelength of interest. Any suitable indirect bandgap semiconductor can here be employed. Alternatively, direct bandgap semiconductors can also be selected such that radiative recombination occurs at wavelengths longer than the cutoff wavelength of the APD absorber.

The pattern provided in the material layer 60 is preferably based on the geometry of the APD array. For example, the geometry of the apertures 62 in the layer can be selected based on the distribution of light to be detected. For a Gaussian distribution, circular openings can be preferred for capturing light to be detected by the photodiodes, while for a non-Gaussian distribution, an elliptical, oval, or other aperture can be preferred. Any aperture geometry can be employed and more than one aperture geometry can be employed across the pattern of apertures. Whatever aperture geometry is employed, the apertures are provided as a pattern in a blanket coating of the material layer 60.

Figure 6:
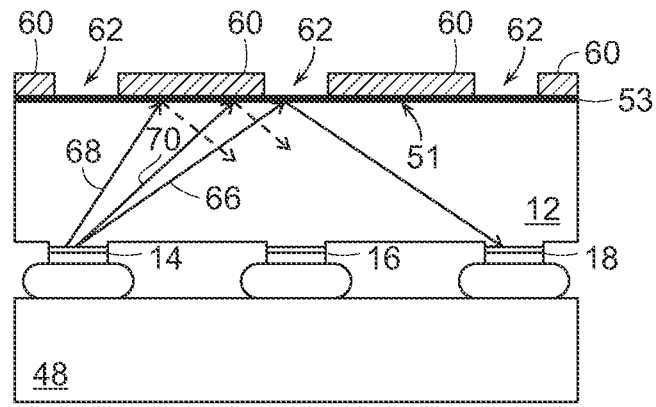
FIG. 6 is a schematic sideview of the APD detector array substrate and back side absorber layer of FIG. 5, here showing the optical path of cross-talk photons that are absorbed by the back side cross-talk blocking layer.

FIG. 6 is a side cross-sectional view of the APD array substrate 12 with an absorbing material layer 60 provided on the surface 51 at which light is incoming to the array. The microlens array is not shown here for clarity. An antireflective coating 53 can be provided on the incoming optical surface 51 and on the microlens surfaces as explained above; this coating 53 was not shown in FIG. 5 for clarity. Given a primary avalanche event at a first photodiode 14, broad spectrum radiation 66, 68, 70 is produced by the avalanche event and is directed within the substrate 12 toward the back surface 51. A first radiated photon 66 reflects off of the back surface 51 at the location of an aperture 62 in the layer 60. This photon is reflected back into the substrate 12 and can be directed to a neighboring photodiode 18, causing a secondary avalanche event at the neighboring photodiode 18. In contrast, radiated photons 68 and 70 reach the back surface layer 60 at a location where the layer material is continuous. These photons 68, 70 may be absorbed by the layer 60, in which case they cannot cause secondary avalanche events at neighboring photodiodes 16, 18. In FIG. 6, the dotted optical rays are intended to indicate attenuation of, rays.

With this secondary photon absorption technique, it is demonstrated in FIG. 6 that it can be preferred to conduct optical ray tracing analyses to determine an appropriate aperture geometry and aperture pattern for the material layer 60 that both enables incoming photons to reach photodiodes and that absorbs photons that are radiated from a photodiode during a primary avalanche event.

EXAMPLE 1

An APD array substrate of InP was fabricated with mesa photodiodes of the SAM configuration and with no back side surface cross-talk blocking layer. A second InP APD array was similarly produced but was provided with a back-surface cross-talk blocking layer having 40 micron-diameter circular openings, each opening located above an underlying photodiode mesa, with a resulting 50 micron-pitch. The back surface cross-talk blocking layer consisted of a blanket coating of titanium of 50 nm in thickness and a blanket coating of gold of 250 nm in thickness, with the circular openings produced by lift-off photolithography on the titanium and gold layers.

Figure 7:
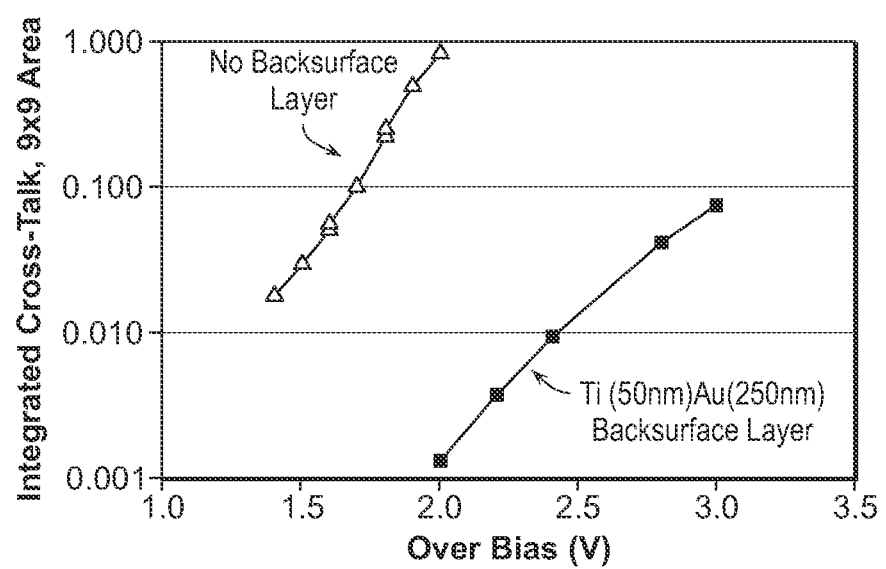
FIG. 7 is a plot of the probability of causing two or more cross-talk events integrated over a 9×9 photodiode neighborhood as a function of photodiode over bias for an APD detector array without a back side cross-talk blocking layer and for an APD array that included a back side cross-talk blocking layer of TiAu.

The optical cross-talk between neighboring photodiodes in a 9×9 area was determined for each of the APD arrays as a function of applied over bias to each photodiode for arming the photodiodes above breakdown to detect incoming photons. FIG. 7 is a plot of an integrated cross-talk probability corresponding to this determination. Specifically, this plot presents the probability of more than one cross-talk avalanche event occurring, integrated over 20 ns after a primary avalanche event, for any primary avalanche events occurring in a 9×9 area of photodiodes.

The plot demonstrates that for a given over bias, e.g., 2 V, the back surface TiAu cross-talk blocking layer provided three orders of magnitude reduction in more than one cross-talk avalanche event for the 9×9 neighborhood of photodiodes. This surprisingly superior performance demonstrates that with appropriate design of the cross-talk blocking layer pattern, significant reduction in cross-talk can be achieved.

Figure 8B:
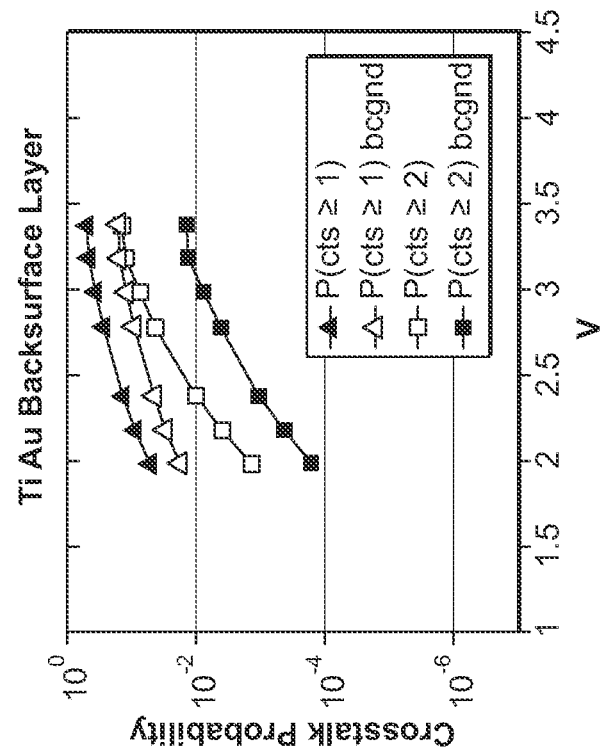
FIGS. 8A-8B are plots of the integrated cross-talk probabilities over a 9×9 photodiode neighborhood as a function of photodiode over bias for an APD detector array without a back side cross-talk blocking layer and for an APD detector array that included a back side cross-talk blocking layer of TiAu, respectively, as well as the corresponding background noise.
Figure 8A:
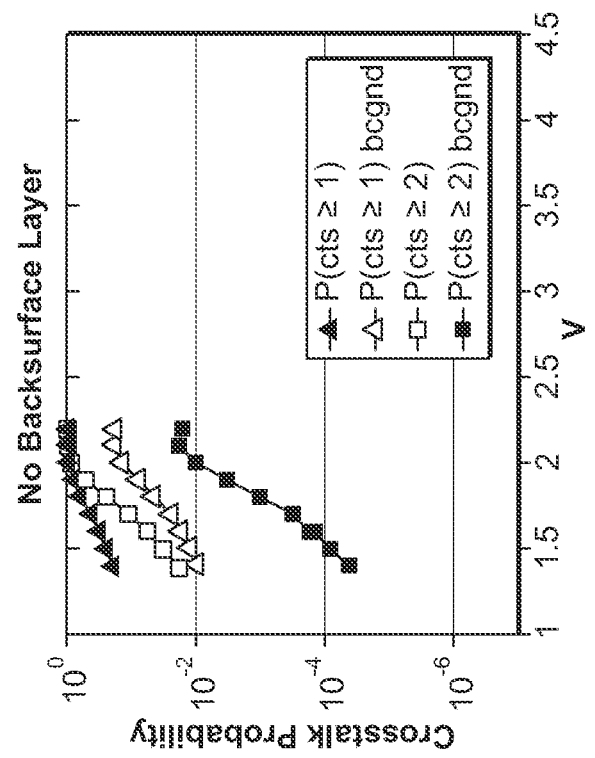

FIGS. 8A-8B present additional probability data for the TiAu-coated APD array substrate and the bare APD array substrate. In FIG. 8A there is plotted for the bare APD array substrate the integrated cross-talk probability, P, for the 20 ns integration period and across the 9×9 photodiode array, that ≥1 secondary avalanche event occurs, and that ≥2 secondary avalanche events occur, with these probabilities also plotted for the inherent background noise of the APD.

FIG. 8B presents the same four data plots of secondary avalanche event probability for the APD array substrate including the TiAu patterned cross-talk blocking layer. These plots demonstrate the dramatic reduction in cross-talk that is achieved by the TiAu cross-talk blocking layer.

Now turning to further details in the design and selection of the cross-talk blocking layer, as explained above and demonstrated in the above example, more than one material can be included in the layer. For example, it is found that some combinations of materials can provide a layer that is characterized by a quite strong evanescent mode for capturing a photon directed to the back surface of the APD array substrate.

Figure 9:
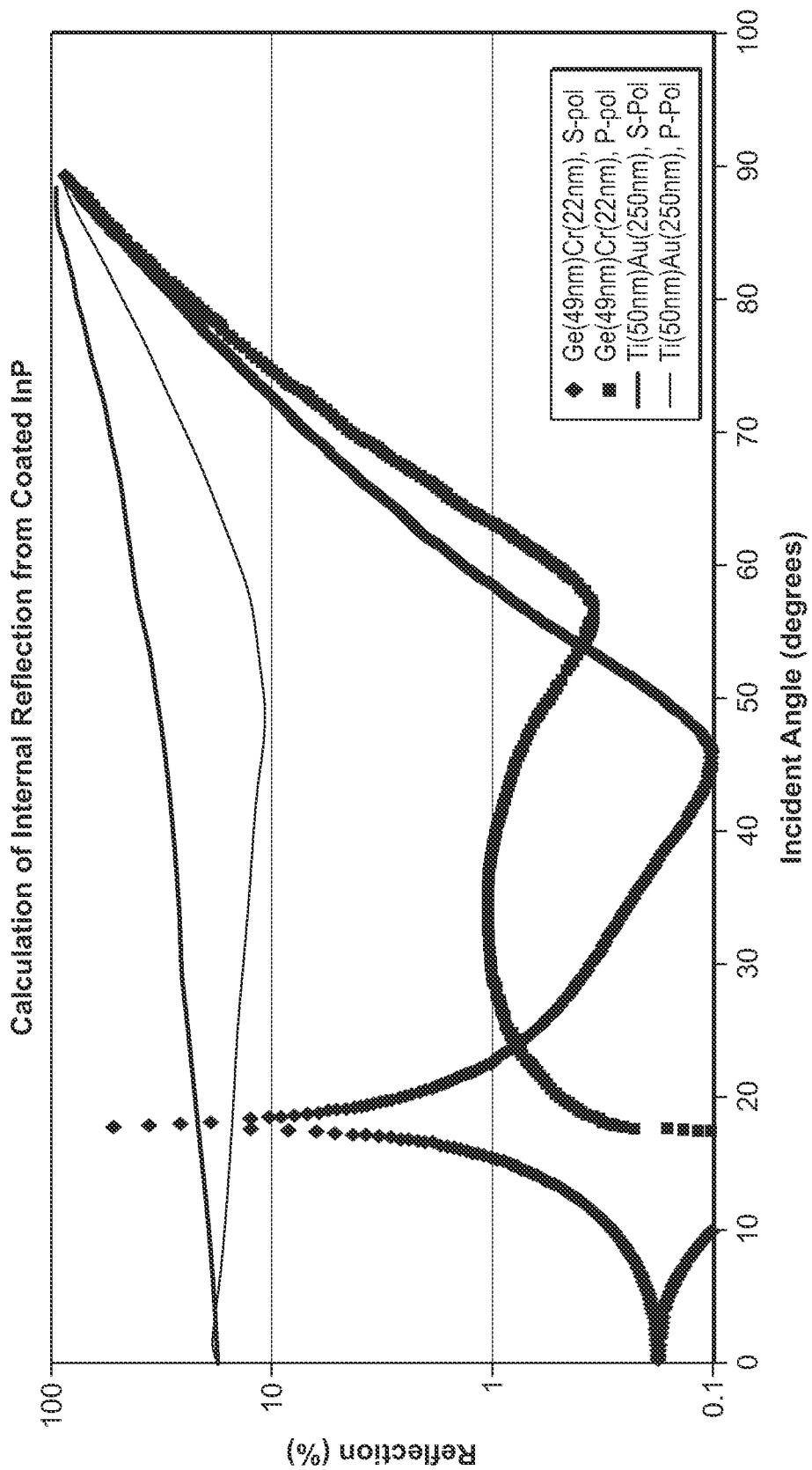
FIG. 9 is a plot of the optical reflection percentage as a function of incident angle for GeCr and TiAu back side cross-talk blocking layers like that of FIG. 5.

FIG. 9 provides plots of the percentage of internal reflection for 1030 nm photons striking the back surface of the APD array substrate as a function of the incident angle at which photons strike the surface for two different combinations of cross-talk blocking layer materials. A first example combination of materials examined here is TiAu, as was described in the example above. A second combination of materials examined here is GeCr. Both s-polarized and p-polarized light is here considered for the two material combinations.

From the plot it is seen that the GeCr cross-talk blocking material layer combination provides a significant reduction over the TiAu combination in broad spectrum reflection from the back surface of the APD array substrate. It is found that the GeCr layer stack is characterized by a strong evanescent mode that effectively captures radiation directed to the stack. This analysis is an example of design considerations that can be made to optimize the selection of materials to be included in the cross-talk blocking layer depending on the substrate dielectric properties, primary operating wavelength, and spectrum of avalanche emission that are characteristic for a given APD array.

Figure 10:
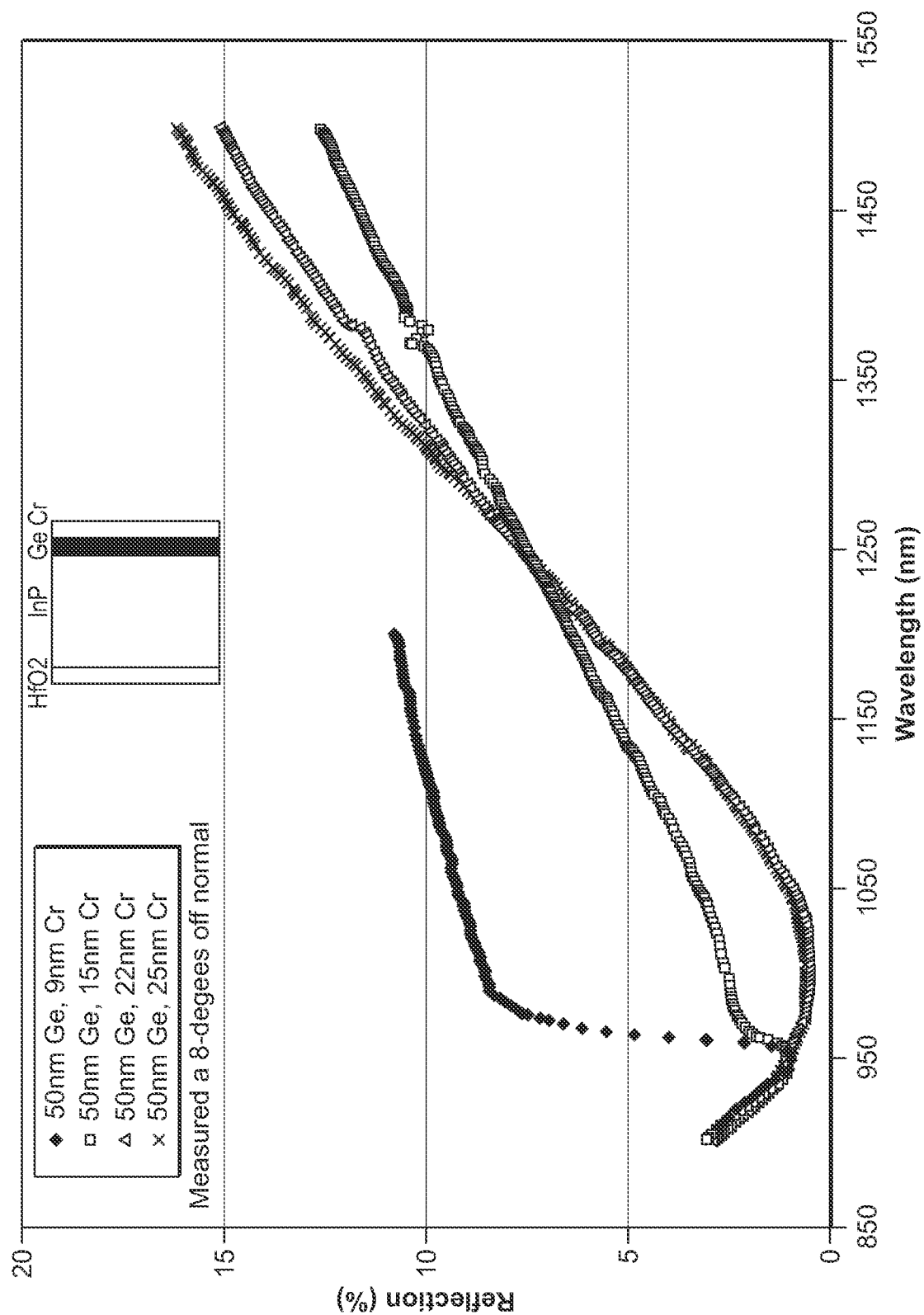
FIG. 10 is a plot of the optical reflection percentage as a function of wavelength for four GeCr back side cross-talk blocking layers like that of FIG. 5 and having differing Cr thicknesses.

Referring also to the plot of FIG. 10, the thicknesses of the materials selected to be included in the cross-talk blocking layer further can be optimized to maximize suppression of optical cross-talk. FIG. 10 provides plots of the percentage of optical reflection from the back surface of the APD array substrate for the GeCr material layer combination, for a 50 nm-thick Ge layer and for different Cr layer thicknesses, namely, 9 nm, 15 nm, 22 nm, and 25 nm, as a function of the wavelength of the secondary emission spectra. This data represents an analysis to determine the optimum Cr thickness, when paired with a Ge layer, for maximizing absorption of secondary photons in the APD array substrate.

As shown in the plot, for this analysis it is found that an increase in Cr material thickness produces a reduction in optical reflection from the GeCr surface layer, with a reflection minimum at a wavelength of about 1000 nm. This result is particularly important because as explained below, significant avalanche spectral emission occurs near this 900-1100 nm range of wavelengths, and a minimum in reflection from the GeCr surface layer is achieved at this range. This data analysis therefore demonstrates a further design consideration of material thickness for minimizing reflection of secondary avalanche emissions from the back surface of the APD array substrate for the spectral emission expected for a given APD array. Taken together, cross-talk blocking layer material composition and thickness, along with aperture geometry and pattern, all based on APD array geometry and photon wavelengths of interest, enable a cross-talk blocking layer that significantly suppresses optical cross-talk due to secondary emission from avalanche events in the APD array.

As explained above, any in a wide range of cross-talk blocking layer arrangements can be employed. In a further example, a continuous blanket of cross-talk blocking layer material, rather than a layer with patterned apertures, can be provided on the back surface of the APD substrate. The blanket layer of material is characterized as allowing a reasonable transmission of primary photons through the layer to reach photodiodes in the array while still acting to attenuate avalanche-emitted light incident at larger off-normal angles. The material examples described above can here be employed where suitable. Evanescent mode coupling to a thin Ge layer is one example of operation of a continuous blanket-coated cross-talk blocking layer that can be provided on the back surface of the APD substrate.

Other configurations can be employed to include spatial elements, i.e., physical structural elements, in an APD array and/or photodiode structure to manipulate the optical path between photodiodes in the array. For example, patterned blocking layers can be located within the bulk of the APD array substrate at specific locations that suppress reflected cross-talk emission.

Figure 11A:
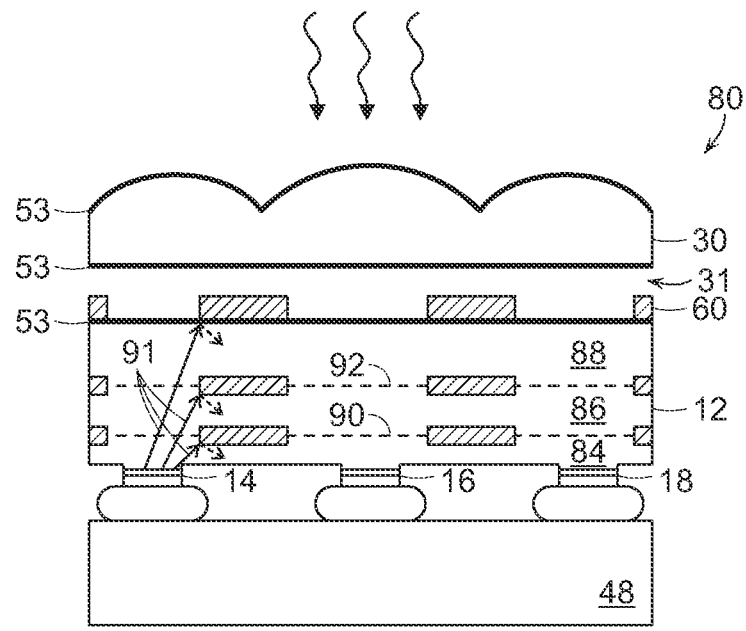
FIG. 11A is a schematic cross-sectional side view of an APD detector array stack including both a back side cross-talk blocking layer like that of FIG. 5 and bulk cross-talk blocking layers.
Figure 11B:
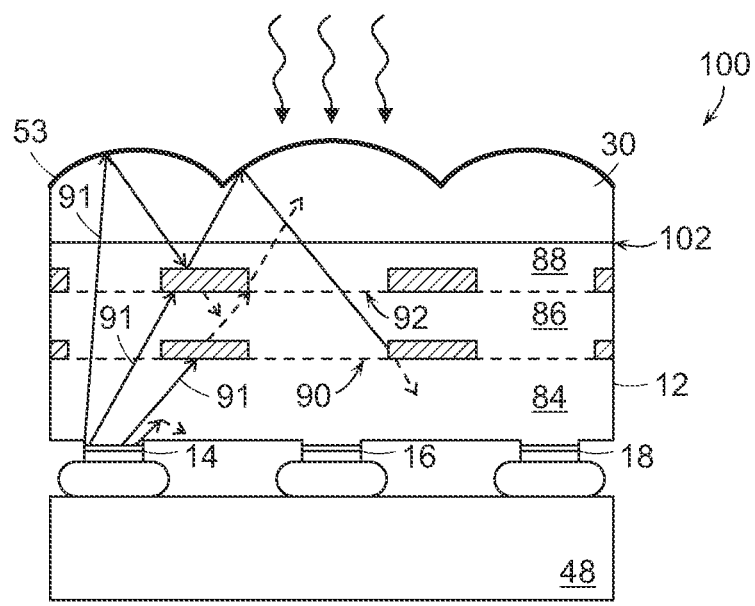
FIG. 11B is a schematic cross-sectional side view of an APD detector array stack including bulk cross-talk blocking layers like that of FIG. 11A and an APD array substrate that is bonded to a microlens array.

FIGS. 11A-11B are schematic sectional side views of example APD array substrate configurations including such patterned blocking layers. In a first example configuration of an APD detector focal plane array 80 including an APD substrate 12 with blocking layers, the substrate includes bulk regions 84, 86, 88, of a selected substrate material, e.g., InP. Two or more of these bulk regions are separated by a plane in which there is disposed a patterned cross-talk blocking layer, e.g., layers 90, 92, of a selected material that is compatible with the bulk regions. For example, given InP bulk regions, a blocking layer of InGaAs can be suitable. The back surface of the APD array substrate can also include the cross-talk blocking material layer 60 described above, as well as an antireflective coating 53. The microlens array 30 here is shown separated from the substrate 12 by an air gap 31, with antireflective coatings 53 provided on the microlens surfaces.

The bulk blocking layers 90, 92, are provided with a selected aperture pattern, e.g., the pattern of circular apertures 62 shown in FIG. 5. The blocking layers can include identical or distinct aperture patterns. Each blocking layer 90, 92, includes continuous regions of blocking material having a composition and geometry that are selected to absorb avalanche photons that are traveling through the substrate. In operation, secondary photons 91 traveling through the substrate from a photodiode that strike one or more such blocking regions may be absorbed by the blocking regions, reducing the likelihood that such photons could cause a secondary avalanche event at a photodiode neighboring the location of a primary avalanche event. Any number of blocking layers and blocking regions within a given blocking layer can be included for reducing optical cross-talk within an APD array substrate, given consideration of material and processing constraints.

The bulk blocking layers thereby operate in the manner of the cross-talk blocking layer 60 on the back surface, with apertures for enabling incoming radiation to reach photodiodes 14, 16, and continuous regions for attenuating radiation that is produced by avalanche events. Radiation 91 directed from a photodiode 14 during an avalanche event may be attenuated at one or more of the bulk blocking layers 90, 92, and/or at the back surface blocking layer 60. The dotted rays are intended in the figure to represent attenuated rays. The bulk blocking layers thereby provide additional attenuation of avalanche radiation and corresponding reduction in optical cross-talk.

As shown in FIG. 11B, such a configuration can be modified further to provide a surface 102 of the substrate 12 that can be bonded to a microlens array 30, in a configuration that provides optimal substrate thickness and blocking array locations to minimize cross-talk within the APD array substrate. One or more layers of material can be included between the substrate and the microlens array to achieve a selected dielectric arrangement.

With the arrangement shown in the figure, secondary photons 91 produced by an avalanche event that travel through the substrate 12 may be absorbed at blocking regions in the blocking layers 90, 92, as in the arrangement of FIG. 11A, either as they travel directly from a photodiode or after reflecting off of the top surface of the microlens array 30. Radiation can thereby be attenuated more than once as that radiation travels through the substrate. The dotted rays in the figure are intended to indicate attenuation of those rays.

This configuration of substrate-to-microlens bonding is effective for cutting off light reflected from the areas of the back side of the focal plane array that may not be available for sufficient back side cross-talk blocking layer placement due to placement of antireflection coatings for primary photon coupling or other required elements.

Figure 12:
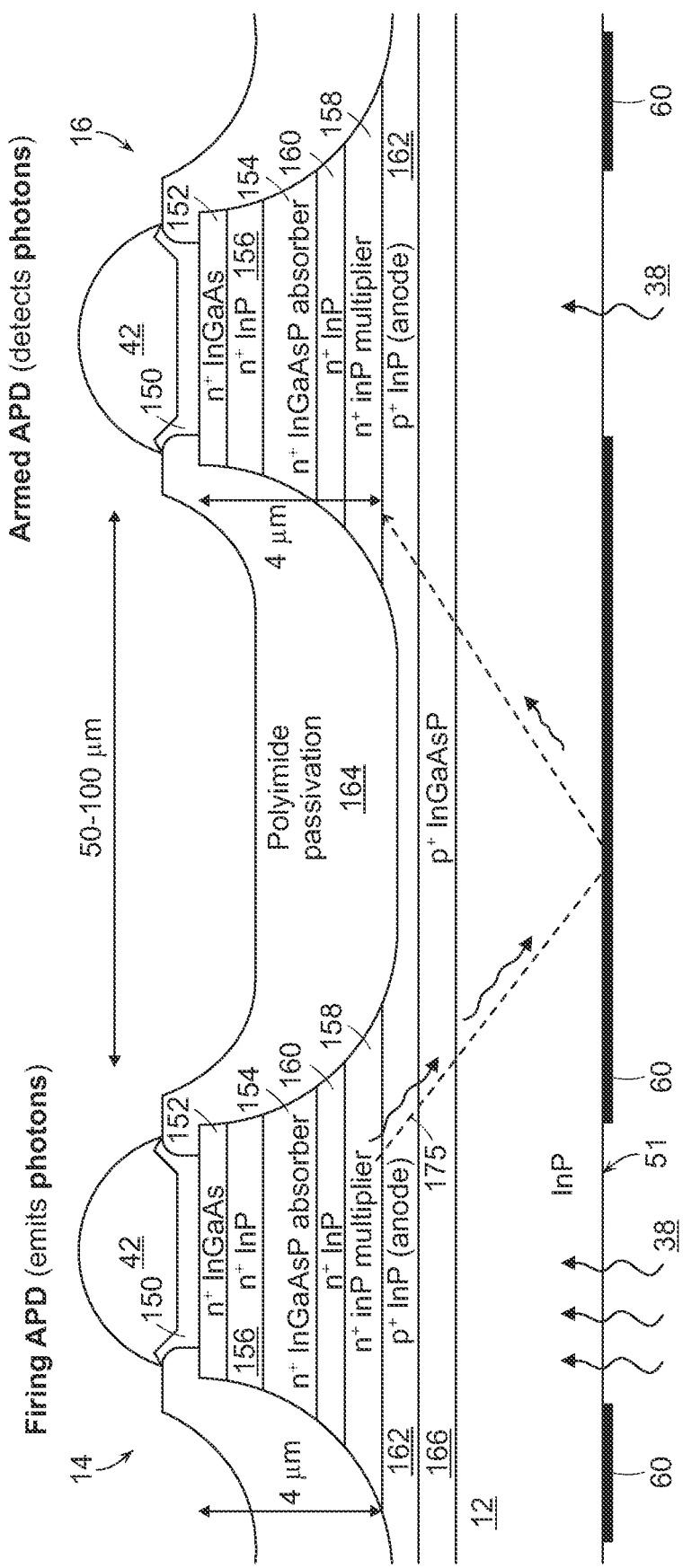
FIG. 12 is a schematic side view of two photodiodes in an APD detector array that includes a spectral filter for attenuating cross-talk photons produced by avalanche events at the photodiodes and that includes a back side cross-talk blocking layer for attenuating cross-talk photons produced by avalanche events.

Turning now to the design specifics of each photodiode in the APD array, referring to FIG. 12 there are shown two adjacent photodiodes 14, 16, disposed on the APD array substrate 12 in the manner described above. For clarity of discussion, the APD array substrate is shown here inverted from the view in the figures above, e.g., FIG. 3. The APD array substrate is shown here including the back side cross-talk blocking layer 60 described above for attenuating radiation that is directed to the back surface 51 during an avalanche event.

Each photodiode is provided as a structure of layers, here as an inverted mesa geometry having sidewalls that are preferably sloped to suppress edge breakdown at high-field regions of the mesa. In one example configuration of photodiode layers shown in the example of FIG. 12, there is provided an arrangement of n-type layers on p-type layers, but such is not required by the invention; any suitable arrangement of doped layers can be employed. At the top of each mesa there is provided a bump contact 42, made to a top contact 150 of each photodiode 14, 16, e.g., with indium, for bump bonding to the ROIC circuitry in the manner described above. In the n-type-on-p-type example configuration here, an $n^+$ contact 152, e.g., InGaAs, is provided under the top contact 150.

The photodiode absorber layer 154, as an example here an $n^-$ InGaAsP absorber layer, is provided below the contact layer 152 separated by an epitaxial layer 156, e.g., of $n^+$ InP.

The photodiode avalanche layer, or multiplier layer 158, as an example here an n⁻ InP multiplier layer, is provided below the absorber layer 154, separated by a field stop layer 160, here as an example an n⁺ InP layer. The lower contact 162, i.e., anode, of the photodiode, here as an example a p+ InP layer, is provided below the multiplier layer 158. A passivating material 164, e.g., a layer of polyimide or other suitable material, is provided over each of the photodiode mesas, covering the mesa sidewalls and the lower anode of each photodiode.

In accordance with the invention, there can be incorporated in the APD array a spectral filter layer designed to pass the wavelengths of interest, i.e., to allow wavelengths to be detected by the APD array to reach the photodiodes, while attenuating other regions of the broad hot carrier avalanche emission spectrum of secondary photons that are produced in the APD array. In one example, a doped semiconductor layer is provided as the spectral filter layer, designed with a selected composition that is characterized by a band gap that absorbs the unwanted regions of the radiation spectrum. The APD structure can incorporate both this spectral filter layer and the cross-talk blocking layer described above to achieve maximum reduction in optical cross-talk in the APD array.

Referring to FIG. 12, such a spectral filter layer 166 that is incorporated into the APD array configuration for attenuating secondary radiation in the APD array can in one example, shown here, be provided under the lower photodiode contact 162. In this example, the spectral filter layer 166 is provided as a p⁺ InGaAsP layer, and extends under all of the mesa photodiodes. In other words, the spectral filter layer 166 is a continuous blanket layer on the APD substrate, with the photodiode mesas disposed on the continuous spectral filter layer. Such is not in general required by the invention, however. The spectral filter layer can be discontinuous across the array or continuous, as-suitable for a given application and APD array geometry.

The bandgap of each of the photodiode absorber and multiplier layers and spectral filter layer of the APD array are specified in concert to achieve efficient and effective Geiger-mode avalanche operation for a selected wavelength or range of wavelengths to be detected as well as to minimize optical cross-talk during photodiode avalanche events. In general, each of the layers of the photodiodes in the APD array substrate are formed of selected semiconducting materials that provide an appropriate band gap for the function of each layer. The absorber layer material is characterized by a band gap that corresponds to a wavelength of interest to be detected by the photodetector. Photons absorbed by the absorber layer generate corresponding electronic charge carriers, and these charge carriers are multiplied by an avalanche event in the multiplier layer for triggering the APD detection circuitry. With this operation, semiconductor materials such as Si, Ge, GaAs, InP, GaSb, InGaAs, InGaAsP, CdTe, ZnS, and other such materials are particularly suitable as APD layers.

The cut-off wavelength of an APD, i.e., the longest wavelength of incoming photons that can be detected by the APD, is determined by the bandgap energy of the photodiode layer having the smallest bandgap. At wavelengths longer than this smallest bandgap, incoming light is not strongly absorbed by the photodiode absorber layer. For example, InGaAs layers can be employed to absorb photons having a wavelength that is less than 1.6 µm, and combined with InP or InAlAs layers to multiply the photo-generated carriers produced in the InGaAs.

Figure 13:
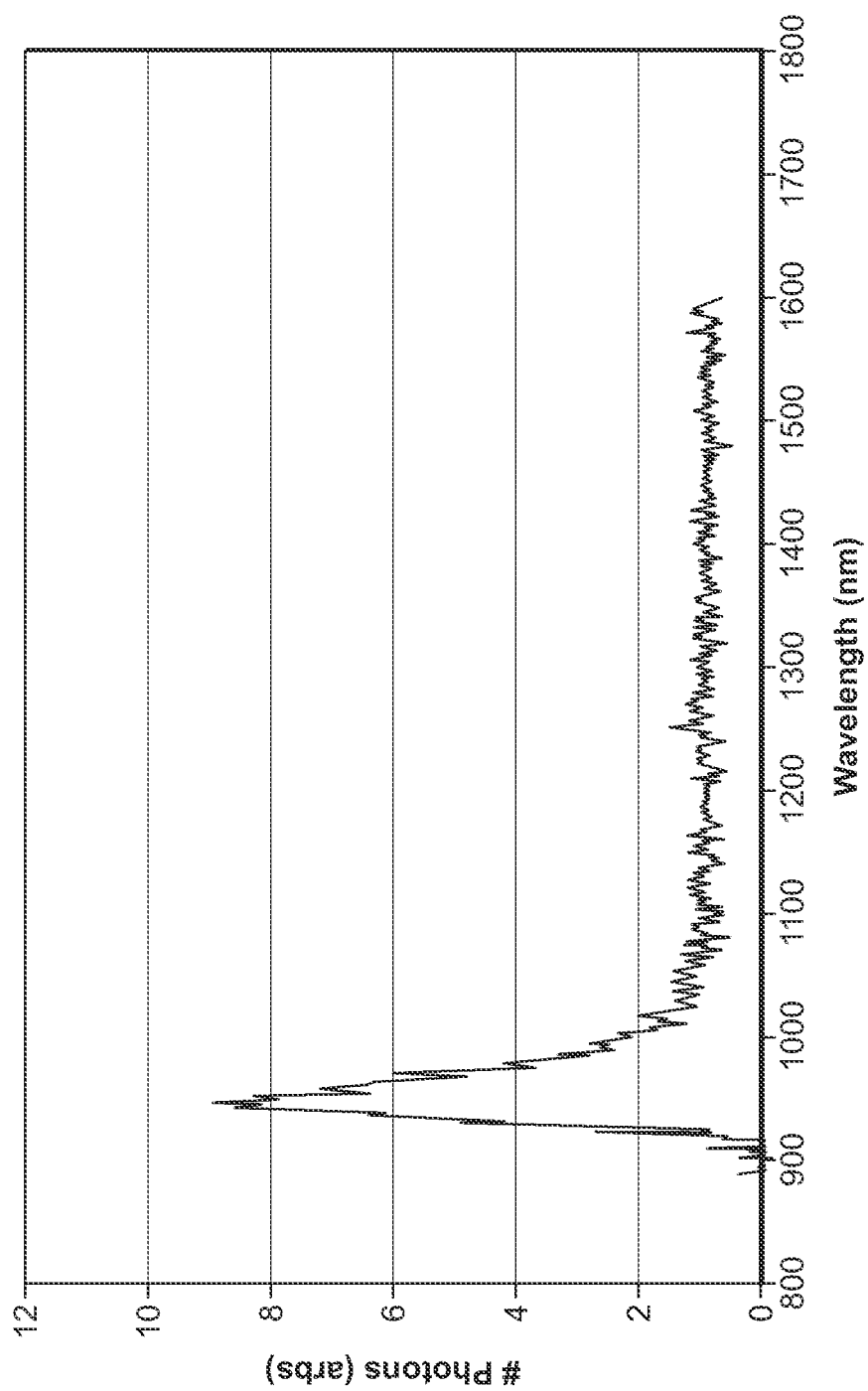
FIG. 13 is a plot of an example characteristic APD detector avalanche photon emission spectrum.

During an avalanche event, as photo-generated electronic charge carriers are multiplied, some recombination and relaxation of carriers and emission of photons occurs, as explained above, and such emission can result in optical cross-talk across the APD array. Avalanching photodiodes tend to emit photons over a broad range of wavelengths, both above and below the bandgap of the avalanche multiplier layer material. FIG. 13 is a plot of the measured spectrum of avalanche emission of photons during an avalanche event, from an InP multiplier layer like that in the photodiode structure of FIG. 12. This spectrum shows a peak in number of emitted photons near the InP bandgap wavelength of 910 nm. The spectrum further is characterized by a broad thermal component with an equivalent temperature near about 3000 K.

For photons generated by the multiplier layer that have a wavelength less than the InP bandgap of 910 nm, the photons are reabsorbed in InP layers of the photodiode or in the nearby substrate, and therefore are not transmitted into the APD array substrate. For photons generated by the multiplier layer that have a wavelength longer than the InGaAs bandgap, the photons are emitted into the APD array substrate, but cannot be strongly absorbed by the absorber layer of other photodiodes. But any photons generated by the multiplier layer having intermediate wavelengths between the bandgap wavelength of the multiplier layer material and the bandgap wavelength of the absorber layer material, in this example between 910 nm and 1600 nm, can be emitted from an avalanching photodiode into the APD array substrate and absorbed by a neighboring photodiode in the array, causing the neighboring photodiode to initiate an avalanche event. That is, any photons generated by the avalanche event with a wavelength shorter than about 1600 nm could trigger another correlated avalanche event in the APD array due to cross talk in InGaAs/InAlAs or InGaAs/InP APDs.

The spectral filter layer 166 of the photodiode array, shown in FIG. 12, is designed to filter out of the APD substrate such photons generated from an avalanche event that could be reabsorbed into neighboring photodiodes, while allowing photons in the primary detection band, i.e., the pass band of radiation wavelengths to be detected by the photodiode array, to reach the photodiodes in the array. This is particular useful for applications in which an APD array is to be employed for detecting a specific wavelength, such as in active laser radar or laser communication receivers.

Figure 14:
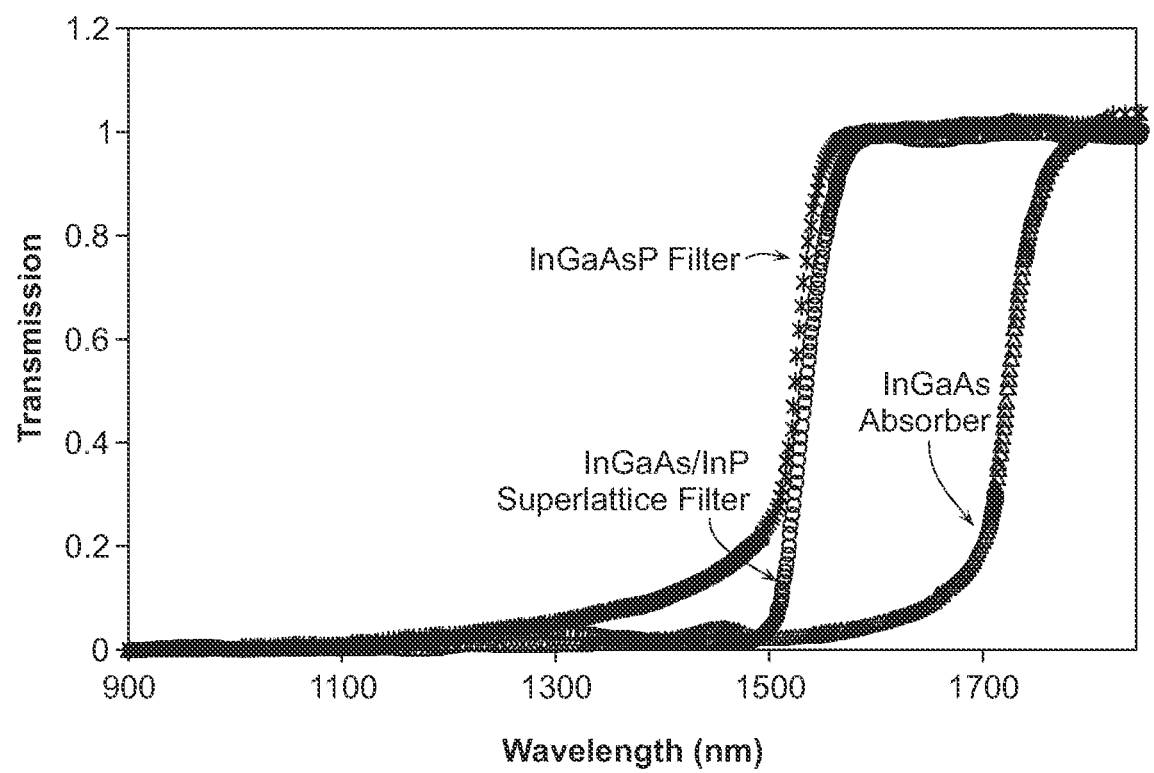
FIG. 14 is a plot of measured cutoff wavelengths of an APD absorber layer and two spectral filters designed for APD detector operation near 1550 nm.

For example, corresponding to the example material combination shown in FIG. 12, there is presented in FIG. 14 the spectral transmission characteristics for an InGaAs APD absorber layer and two different spectral filter layers, one bulk, one a superlattice, designed for operation near 1550 nm. The In.60 Ga.40 As.85 P.15 bulk spectral filter layer 166 considered in FIG. 14 will tend to absorb avalanche-emitted photons shorter than 1550 nm, while allowing low-loss transmission of primary photons, i.e., photons 38 of 1550 nm in wavelength, to the InGaAs APD absorber layer 154.

A similar filter characteristic can be achieved using multiple thinner layers of high and low bandgap energy materials, e.g., configured as a superlattice. The spectral filter cutoff characteristic of one example of such a superlattice filter is also shown in FIG. 14 for comparison with the bulk In.60 Ga.40 As.85 P.15 filter. The superlattice in this example utilizes 200 periods of alternating 56 angstrom-thick InGaAs layers and 60 angstrom-thick InP layers to form a superlattice with an effective cutoff wavelength nearly equivalent to a bulk InGaAsP filter layer.

In another example, given the InGaAsP absorber layer 154 and InP multiplier layer 158 in the example photodiode of FIG. 12, the photodiode configuration can be designed to operate at about 1064 nm. The InGaAsP spectral filter layer 166 is here provided with a bandgap that is adjusted for absorbing slightly shorter wavelengths than 1064 nm; i.e., the spectral filter layer is characterized by a bandgap that is between that of the InP multiplier layer and the InGaAsP absorber layer. Thus, as seen by this example, the spectral filter layer is specifically designed to pass a range of wavelengths of interest to be detected by the APD array while attenuating other regions of the broad hot carrier avalanche emission spectrum. The composition of the spectral filter layer is therefore preferably a semiconductor having a bandgap that absorbs the unwanted shorter-wavelength regions of the avalanche radiation spectrum.

The APD absorption layer is therefore designed in concert with the spectral filter layer to provide the absorption/filter combination desired for a given application. Preferably, the APD absorption layer is designed with the spectral filter layer to maintain reasonable lattice-matching to the substrate, e.g., the InP substrate in the example of FIG. 12, and at the same time to give appropriate band gaps to eliminate, or significantly reduce, sensitivity of the APD array to wavelengths other than the primary source. This can be achieved by tailoring the composition of the APD absorber layer to maximize absorption close to the primary wavelength of interest, e.g., 1064 nm for the InGaAsP/InP example, while making sure that this layer doesn't absorb light of wavelength much longer than that of the primary source, i.e., >1064 nm. The spectral filter layer of InGaAsP is then fine tuned to attenuate light of wavelengths shorter than the primary source, e.g., 1064 nm. For example, given a range of various GaInAsP alloys, transmission of a 1030 nm source can be maximized while significantly attenuating shorter wavelengths by selection of a synergistic combination of absorber layer and filter layer materials.

Figure 15:
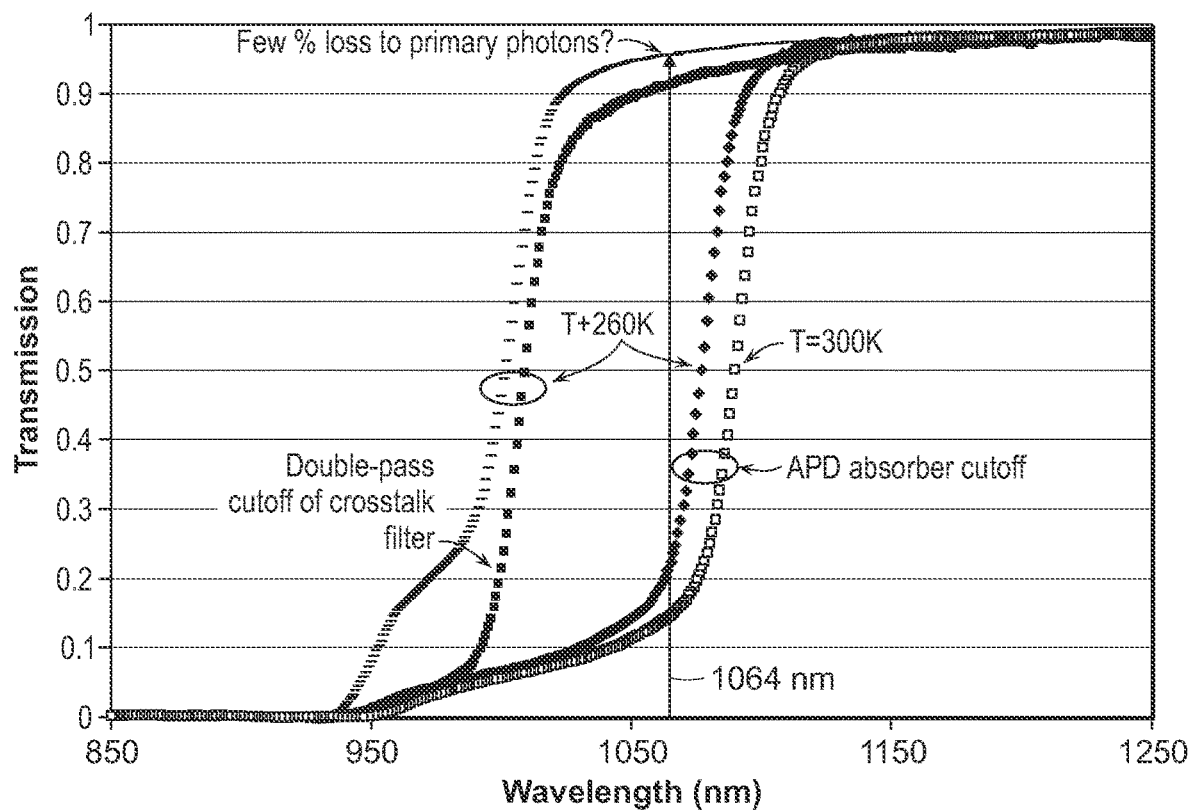
FIG. 15 is a plot of design specification for wavelength cutoff of an absorber layer and of a spectral filter layer for the APDs of FIG. 12.

Accordingly, in practice, it can be preferred to set the absorber and spectral filter layer bandgaps so that a wavelength spectrum of, e.g., between about 20 and 200 nm width is provided for transmission, rather than attenuation, of incoming radiation. FIG. 15 is a plot of an example of an optimization analysis of the cutoff wavelength of the absorber layer to reduce the spectrum of avalanche cross-talk and retain high photon detection efficiency for the wavelength of interest, here 1060 nm. In practice, the absorber cut-off wavelength is shifted until the detection efficiency begins to drop at the temperature of operation. As is shown in the plot, some incoming primary photons may be lost to the spectral filter layer, and thus it can be preferred to fine tune the cutoff wavelength of the spectral filter layer.

Because many semiconductor bandgap energies shift with temperature, a known fixed operating temperature allows for the design of a spectral filter layer and photodiode absorber layer pair with a narrower response band. For example, FIG. 15 shows the ~14 nm shift in the absorber layer cutoff wavelength as the operating temperature changes from 300K to 260K. A similar temperature change would induce ~30 nm shift in the cutoff wavelength in the InGaAs APD absorber designed for 1550 nm, as in FIG. 14. Thus the optimum APD array design including a spectral filter layer for a variable operating temperature preferably is characterized by a spectral filter cut-off designed for warmest operating temperature and APD absorber cut-off designed for coolest operating temperature, resulting in a wider separation between the filter and absorber.

The plot here assumes that avalanche cross-talk photons make a "double-pass" through the spectral filter layer. Referring back to FIG. 12, in considering this "double-pass" of cross-talk photons through the spectral filter layer, two neighboring photodiodes are shown, and the function of the spectral filter layer 166, in combination with the back surface cross-talk blocking layer 60, for significantly reducing cross-talk in the APD array between the neighboring photodiodes is demonstrated. Primary incoming photons 38 are incident at the APD array at the optical input surface 51 of the array. The photons are directed through apertures in the back surface blocking layer 60 to photodiodes. Given absorption of an incoming primary photon at a first photodiode 14, a secondary avalanche photon 175 is generated in the multiplier layer 158 of the photodiode 14 during an avalanche event that was initiated by absorption of the primary incoming photon.

The secondary photon 175 is directed to the APD array substrate and traverses the InGaAsP spectral filter layer 166, at which the photon can be absorbed, thereby significantly attenuating the avalanche radiation in the APD array substrate. The reduced radiation 175 then reaches the absorber material of the back surface layer 60 where the radiation is further, if not completely attenuated. Reflecting off of the back surface layer 60, the photon 175 then is directed back to the APD array substrate, again traversing the InGaAsP spectral filter layer 166. This second traversal, or double-pass, of the spectral filter layer significantly, if not completely attenuates the avalanche radiation. For a large population of such secondary photons, this second traversal of the spectral filter layer absorbs the photon. Any secondary photons not absorbed by the spectral filter layer that can be absorbed at the absorber layer 154 of a neighboring photodiode can cause an avalanche event at that neighboring photodiode. Thus, the continuous spectral filter layer enables the double pass of an avalanche photon on its traversal from a first photodiode through the APD array substrate to the back surface of the substrate and on to a neighboring photodiode. With this arrangement the spectral filter layer provides a particularly effective filter configuration in an elegantly simple geometry.

The back-surface cross-talk blocking layer 60, when incorporated into the APD array with the spectral filter layer 166 as in the example of FIG. 12, is preferably designed based on the requirements for the spectral filter. For example, the cross-talk blocking layer can be designed to absorb a narrow band of wavelengths that might by necessity be transmitted through the spectral filter layer and could be absorbed by another APD. Thus, the characteristic absorption of the cross-talk blocking layer materials, when included with a spectral filter layer in the APD array, needs to be achieved only over a relatively narrow band of wavelengths that are not addressed by the spectral filter layer. If a spectral filter layer is not included in the APD array, then the cross-talk blocking layer is required to attenuate back-side radiation reflection over a larger range of wavelengths. Accordingly, it can be found for many applications that a combination of the spectral filter layer and the cross-talk blocking layer can be preferred to ease design constraints.

EXAMPLE 2

An APD array including photodiodes having the configuration illustrated in FIG. 12 was fabricated with the semiconductor alloy layers specified in FIG. 12. The thicknesses and compositions of the layers were as follows: 1.5 µm-thick In.89 Ga.11 As.23 P.77 absorber layer, having a 1055 nm bandgap, 1.4 µm-thick InP multiplier layer, 1 µm-thick In.92 Ga.08 As.16 P.84 spectral filter layer, having a 1011 nm bandgap. A similar APD array was fabricated, but not including the spectral filter layer. The thicknesses and compositions of the layers were as follows: 1.5 µm-thick In.81 Ga.19 As.42 P.58 absorber layer, having a 1175 nm bandgap, and a 1.4 µm-thick InP multiplier layer. Both APD arrays included a back-side cross-talk blocking layer. For the array including a spectral filter layer a 50 nm-thick Ge layer and a 25 nm-thick Cr layer were deposited on the back surface. For the APD array without a spectral filter layer the back surface layer consisted of a coating of titanium of 50 nm in thickness and a coating of gold of 250 nm in thickness. Both arrays included $HfO_2$ anti-reflection coatings inside circular apertures that were provided in the backside blocking layers.

Figure 16:
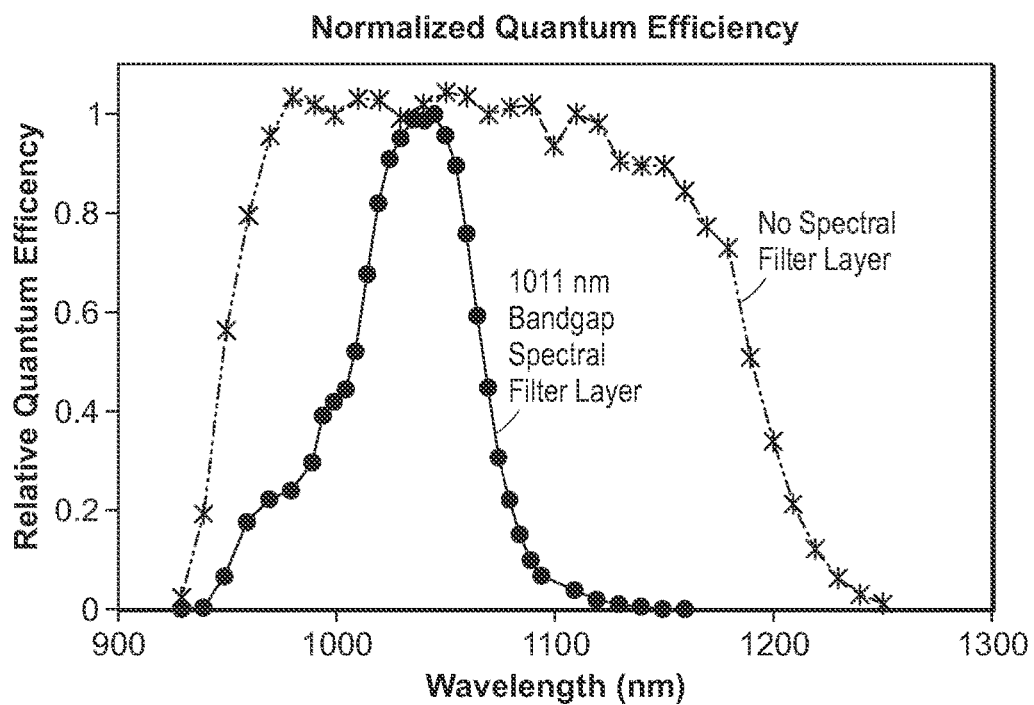
FIG. 16 is a plot of normalized quantum efficiency as a function of wavelength for APDs designed with and without a spectral filter layer like that of FIG. 12.

FIG. 16 is a plot of the relative quantum efficiency as a function of wavelength for the two APD arrays. The plot with closed circles corresponds to the APD array including the spectral filter, and the curve with star points corresponds to the APD array not including a spectral filter. The short wavelength response is limited by the InP substrate for the array without the spectral filter, whereas the cut-off is shifted to longer wavelengths in the APD array with the spectral filter. The spectral filter layer absorbed photons having wavelengths corresponding to the bandgap of the filter layer (1011 nm) and shorter. This limits sensitivity of the APD array to 920-1030 nm photons that might be emitted in an avalanche event. Comparing the long wavelength cut-off of the two arrays, the bandgap of the absorber has been shifted down to 1055 nm in the array including the spectral filter. This APD array retains high efficiency at 1030-1050 nm, while reducing sensitivity to 1060-1200 nm photons that might be emitted in an avalanche event.

Figure 17:
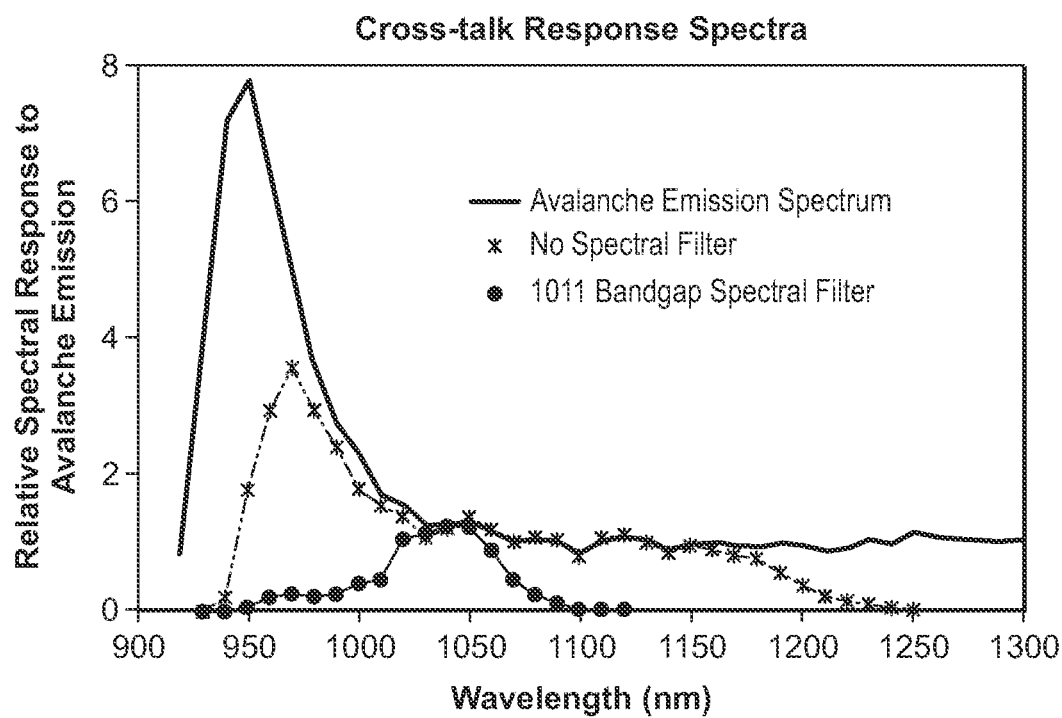
FIG. 17 is a plot of the spectral response to cross-talk avalanche emission for an APD detector array with and without a spectral filter layer like that of FIG. 12, and is a plot of the avalanche emission spectrum.

FIG. 17 is a plot of the spectral response for the two APD arrays as a function of wavelength. Also plotted is the avalanche photon emission spectrum for the InP multiplier layer. The plot with closed circles corresponds to the APD array including the spectral filter, and the curve with star points corresponds to the APD array not including a spectral filter. The spectrum of cross-talk to avalanche emission for the APD array including a spectral filter layer is found to be limited and centered at around 1040 nm. The filter rejects the majority of the large peak in avalanche emission at shorter wavelengths near 950 nm. The data thereby demonstrates that the avalanche emission spectrum is very significantly attenuated by the spectral filter layer. Additionally, this shows the benefit of including an APD absorber layer that is tuned closely to the primary photon wavelength of interest.

Figure 18:
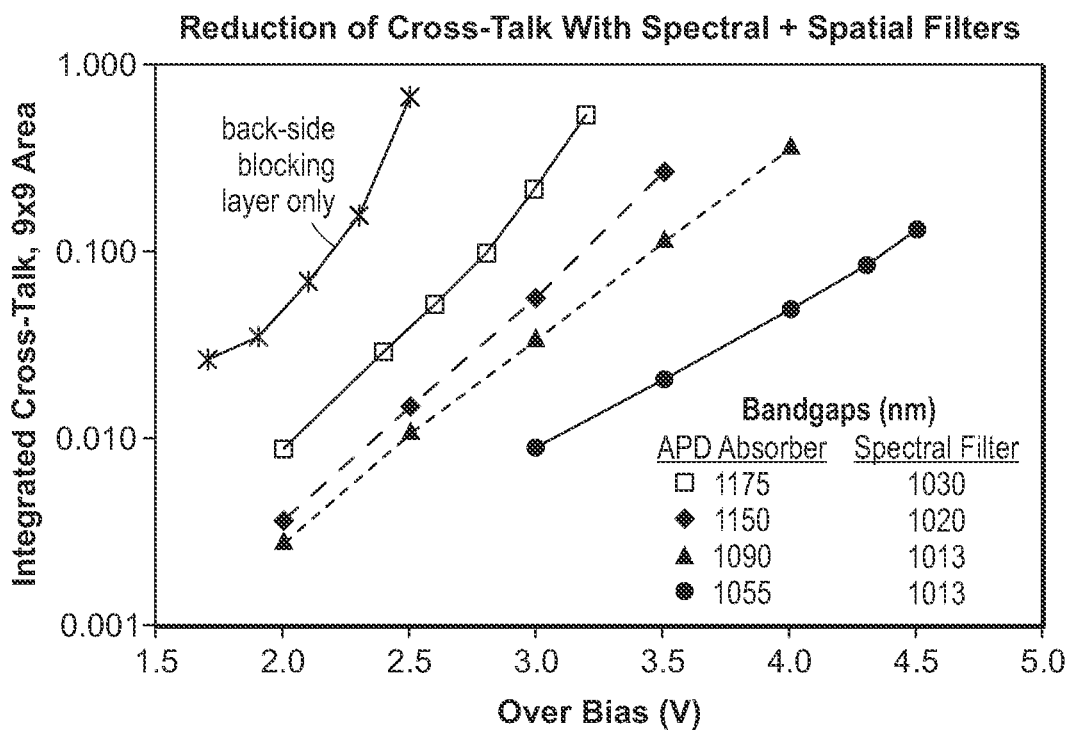
FIG. 18 is a plot of the integrated cross-talk probability over a 9×9 photodiode neighborhood as a function of photodiode over bias for an APD detector array with a back side absorber layer and with four differing absorbers and spectral filter layers.

FIG. 18 is a plot of the integrated probability of causing two or more cross-talk events for a 9×9 area of photodiodes, over a duration of 20 ns after an avalanche event, as a function of over bias voltage of photodiodes for several different spectral filter layer designs. All of the APDs here are 20 microns in diameter, all APD absorber layers are 1.5 microns-thick, and all spectral filter layers are 1 micron-thick in the designs that include spectral filters. Shown in the curve with star points in the plot is the cross-talk probability for an APD array without a spectral filter layer, but including a 50 nm-thick Ti and 200 nm-thick Au back side cross-talk blocking layer and an In.81 Ga.19 As.42 P.58 APD absorber layer, characterized by a 1175 nm bandgap.

Also shown is the cross-talk probability for APD arrays including four different combinations of spectral filter layers and APD absorber layers. The curve marked by open squares corresponds to an APD array including a 1.5 µm-thick In.81 Ga.19 As.42 P.58 absorber layer of 1175 nm in bandgap and 1 µm-thick In.91 Ga.09 As.19 P.81 spectral filter layer of 1030 nm bandgap, and also includes a 50 nm-thick Ti and 200 nm-thick Au back side cross-talk blocking layer. The solid diamond curve corresponds to an APD array including a 1.5 µ-m-thick In.82 Ga.18 As.38 P.62 absorber layer of 1150 nm in bandgap and a 1 µm-thick In.92 Ga.08 As.18 P.82 spectral filter layer of 1020 nm in bandgap, with a 50 nm-thick Ti and 200 nm-thick Au back side cross-talk blocking layer. The solid triangle curve corresponds to a 1.5 µm-thick In.86 Ga.14 As.29 P.71 absorber layer of 1090 nm in bandgap and a 1 µm-thick In.92 Ga.08 As.16 P.84 spectral filter layer of 1013 nm in bandgap, with a 50 nm-thick Ge and 25 nm-thick Cr back side cross-talk blocking layer. The solid circle curve corresponds to an APD array including a 1.5 µm-thick In.89 Ga.11 As.23 P.77 absorber layer of 1055 nm in bandgap and a 1 µm-thick In.92 Ga.08 As.16 P.84 spectral filter layer of 1013 nm in bandgap, with a 50 nm-thick Ge and a 25 nm-thick Cr back side cross-talk blocking layer.

As can be seen by the results in FIG. 18, the integrated cross-talk is reduced by roughly a factor of 100 compared to the array without a spectral filter layer. Cross-talk is reduced in each successive curve as the spectral bandwidth between the spectral filter cut-off and APD absorber cut-off is reduced.

Turning now to considerations for fabrication of the APD array, no particular fabrication sequence is required by the invention. Any in a wide range of semiconductor materials processing techniques can be employed for producing an APD array. In one example process for producing an APD array like that of FIG. 12, the APD structures are grown by organometallic vapor phase epitaxy (OMVPE) on (1 0 0) InP substrates. All of p$^+$, n$^+$, and n$^-$ substrate types can be employed. The spectral filter layer 166 of p$^+$ InGaAsP of 1 micron in thickness is grown first, and then a two-step p$^+$ InP layer 162 growth is carried out to produce the anode. The lower part of this anode layer is about 1.5 µm thick and includes Zn doping of $1.6 \times 10^{18}$ cm$^{-3}$, while the upper part is about 0.5 µm-thick and is doped at about $8 \times 10^{17}$ cm$^{-3}$. The nominally undoped InP avalanche layer 158 is grown next, having a thickness of about 0.8-2.0 µm, with an n-type concentration of $10^{15}$ cm$^{-3}$. This is followed by a heavily Si-doped n$^+$ InP field stop layer, of $3.5-7 \times 10^{17}$ cm$^{-3}$. The thickness of this layer is selected, based on the layer doping, so that first, the absorber layer is fully depleted at the photodiode over bias and temperature of operation and second, the maximum field in the absorber layer is below a maximum value at the operating conditions. For an APD array designed for incoming radiation of 1.06 µm wavelength, the maximum field in the absorber is kept below about $1 \times 10^5$ V/cm, while for 1.55 µm wavelength APD arrays, it is kept as small as possible, e.g., about $10^4$ V/cm. The first criterion assures that photo-carriers generated anywhere in the absorber layer are swept quickly to the avalanche layer, thereby reducing jitter. The second criterion minimizes any field-enhanced dark current in the absorber layer.

A compositionally-graded InGaAsP layer can be included, if desired, to facilitate the injection of photogenerated holes from the absorber layer into the avalanche layer. This layer is not shown explicitly in the figures as it is of the same materials as the absorber layer, but it is to be understood that such is included in the photodiode structure. The graded layer can be, e.g., about 50 nm in thickness for a 1.06 µm wavelength photodiode and about 100 nm in thickness for a 1.55 µm wavelength photodiode. The nominally undoped InGaAsP or InGaAs absorber layer, having a doping level of less than about $10^{15}$ cm$^{-3}$, of thickness about 1.5 µm is then grown. This is followed by an n$^+$ InP layer and a 10 nm-thick n⁺ contact layer. For all layer growth steps, a growth temperature of about 625° C. can be preferred to minimize dark count rate.

With the photodiode layers grown, the photodiode mesa structures can be produced if such are desired for a given application. The mesa fabrication process preferably isolates individual photodiodes without introducing defects or current paths that could degrade photodiode performance. In one mesa fabrication process, the grown active layers are etched completely through to the spectral filter layer 166. The mesa etch can be conducted as, e.g., either a nonselective wet etch or an inductively-coupled plasma reactive ion etch followed by a brief wet cleanup etch to remove ion damage. Large APD array fabrication generally requires the use of such a dry etch process because the dry etch process produces a more spatially-uniform etch across a wafer than a deep wet etch. After mesa etching, passivation is applied and a cathode ohmic contact is made to the top of the mesas. If the photodiode array is configured as in FIG. 12, as back-illuminated devices mated to ROICs, then a disk-shaped contact is used, while for top-illuminated devices, an annulus-shaped contact is used. Anode contacts are either made to the back of the APD array substrate or on the top to the etched p⁺ anode layer.

For a back-illumination configuration, the substrate is thinned to about 150 µm and antireflection coatings applied to the back surface. After photolithography and etching to define the antireflection-coated apertures, the backside cross-talk blocking layers are evaporated. In one example process, 50 nm of Ge is evaporated, followed by evaporation of 25 nm of Cr, on the entire back surface. A lift-off procedure is then carried out to remove the backside material from the regions above the remaining antireflection-coated apertures, producing a self-aligned duality of antireflection coating apertures and backside blocking layer material regions.

Passivation materials such as polyimide, polyimide overcoated with silicon nitride or silicon dioxide, bisbenzocyclotene (BCB), hydrogensilsesquioxanes (HSQ), pyrolytic silicon dioxide, regrown InP, or other suitable material can be employed for passivation of the photodiodes in the APD array. A polyimide-silicon nitride two-layer coating can be preferred because polyimide coats each mesa and passivates the semiconductor surface and an overcoating of silicon nitride fills in any microcracking and protects the polyimide from low levels of moisture.

A microlens array for mating with the APD array can be provided as, e.g., GaP or other suitable material, with a lens-to-lens pitch of, e.g., about 50 µm and a thickness of, e.g., about 100 µm. The microlens array is preferably coated with antireflection coatings on all surfaces and paired with an APD array substrate of appropriate thickness for the focal length of the lens; the substrate can be thinned to match the microlens focal length. Preferably the lens array and APD array are precisely aligned, e.g., with active alignment diodes that are provided at, e.g., corners of the APD array, that produce photocurrent which can be monitored as the arrays are actively aligned. Bump bonding, e.g., with In bumps, can be completed between the APD array and a ROIC prior to microlens array attachment.

This example fabrication sequence can be modified as-necessary to accommodate various features in the APD array substrate. For example, bulk cross-talk blocking layers can be incorporated into the APD array substrate as in the configurations illustrated in FIGS. 11A-11B. FIGS. 19A-H are schematic cross-sectional side views of the APD platform during fabrication of such bulk blocking layers.

As shown in FIG. 19A, on a selected substrate, e.g., a (0 0 1) InP substrate, there is grown by OMVPE an InP buffer layer 200, a GaInAs etch stop layer 205, an InP spacer layer 210, and a GaInAs bulk cross-talk blocking layer 212. This blocking layer 212 is patterned, as shown in FIG. 19B, to include continuous regions 214 and apertures 216, as described above. The apertures are provided to enable incoming light to reach photodiodes supported by the substrate 12 while the continuous regions 214 are provided to attenuate avalanche photon emission in the manner described above.

Figure 19E:
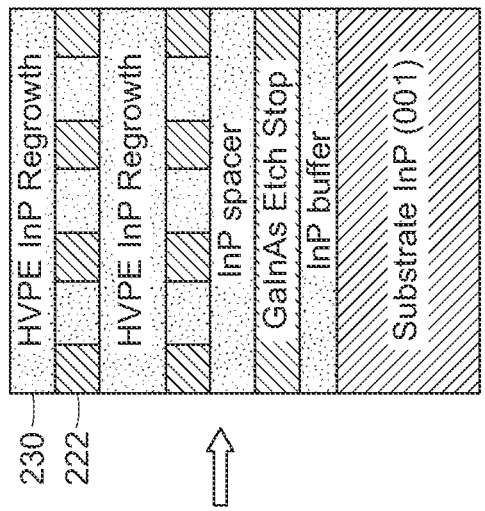
Figure 19F:
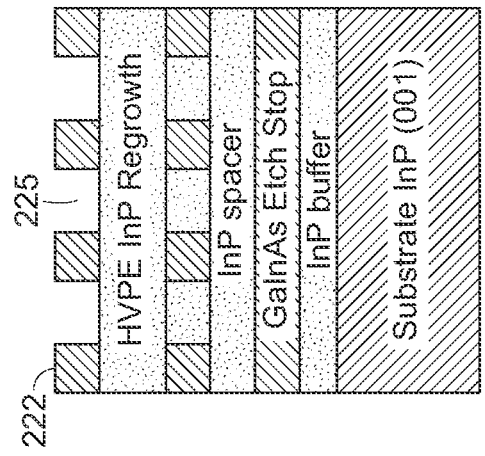

Referring to FIG. 19C, InP is then regrown, e.g., by HVPE, in the aperture regions 216 of the blocking layer 212 and further is grown on top of the blocking layer to form an InP layer 220. As shown in FIG. 19D, a second blocking layer 222 can then be grown, e.g., by OMVPE, and as shown in FIG. 19E, patterned to form apertures 225 in the continuous blocking layer 222. Then as shown in FIG. 19F, HVPE InP growth is carried out to fill the apertures 225 with material and to form an additional InP layer 230. This process of stacking blocking layers on InP spacer layers can be continued as-desired to form any selected number of bulk blocking layer structures.

Figure 19G:
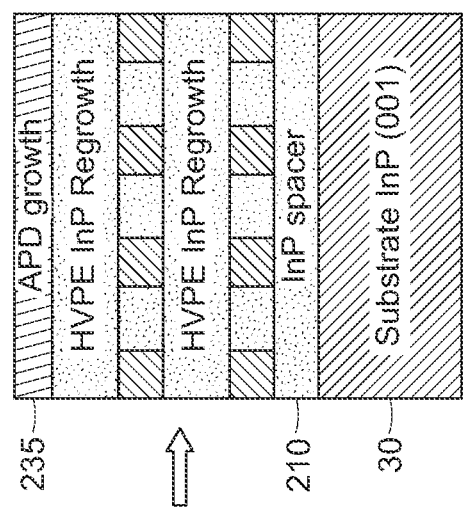
Figure 19H:
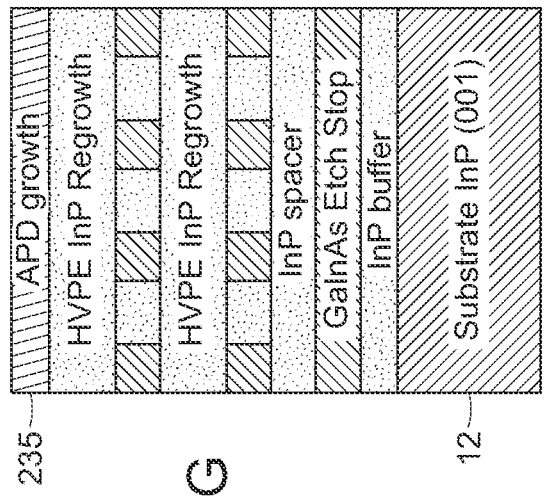

As shown in FIG. 19G, OMVPE growth of the APD array photodiode layers 235, including a spectral filter layer, is then conducted on the top InP regrowth layer 230. The InP substrate 12 can then be removed, e.g., by an etch that stops on the GaInAs etch stop layer 205, and the microlens array, e.g., the GaP array described above, can be bonded directly to the bottom InP spacer layer 210 as shown in FIG. 19H. With this step, the substrate-to-lens bonding structure of FIG. 11B is complete.

Other fabrication processes can be employed in accordance with the invention to produce any suitable photodiode array structure and focal plane stack. The invention is not limited to a particular fabrication sequence and is not limited to a particular set of photodiode materials. Any materials that enable production of G-M avalanche photodiode operation can be employed.

With this discussion, there is provided both the fabrication sequence and design of an APD array with significantly reduced optical cross-talk. As explained above, cross-talk in Geiger-mode APDs can result in a range of operational limitations, depending on the application of the APDs. Cross-talk can cause ghosting/blurring of angle-angle-range images in 3-D laser radar applications, and can induce bit errors in single-photon communication application. Because G-M APDs must be held in an "off" state for a period of time prior to detection of succeeding photons, APDs that are triggered due to cross-talk cannot detect another photon until they are reset. This can cause premature saturation of an APD receiver, perhaps even blinding an APD array before primary photons are detected. Because cross-talk is a super-linear process, reduction in the strength of cross-talk by a factor of 2-8, as provided by the invention and described above, can eliminate such a runaway process that could otherwise blind the majority of APDs in an array.

The spatial blocking layers and spectral filters described above for reducing APD cross-talk are easily fabricated, requiring only the already existing processes utilized for G-M APD array fabrication. The spectral filter layer can be grown along with the APD array structure, with no additional fabrication steps required. Optimization of the filter layer material, in concert with optimization of the absorber layer material, for specific cut-off wavelengths and a selected optical spectrum pass band requires only modest recalibration of growth system parameters prior to APD array growth. The spatial blocking layers and the spectral filter can be implemented in silicon, in silicon-based material systems, in III-V material systems, other II-VI systems, or other suitable material systems, and thus these elements are not limited to a particular material system.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. An avalanche photodiode detector comprising:
a substrate (12) including an array of avalanche photodiodes (14), each avalanche photodiode provided as a structure of photodiode layers including a semiconducting input radiation absorber layer (154) having an absorber layer bandgap and a semiconducting avalanche multiplier layer (158) having a multiplier layer bandgap;
an optical interface surface (51) of the substrate arranged for accepting external input radiation; and
at least one cross-talk spectral filter layer (166) of material disposed in the substrate adjacent to the structure of photodiode layers and extending as a continuous blanket spectral filter layer across the array of avalanche photodiodes, the cross talk spectral filter layer comprising a semiconducting material having a band gap that is between the absorber layer band gap and the multiplier layer band gap to filter out radiation wavelengths in the substrate produced by the avalanche multiplier layer of the photodiodes in the array while allowing external input radiation to pass to the semiconducting input radiation absorber layer.

2. The avalanche photodiode detector of claim 1 wherein the semiconducting input radiation absorber layer (154) is characterized by a semiconducting band gap that sets a long wavelength boundary on a pass band of radiation wavelengths to be detected by the photodiode array and wherein the cross-talk spectral filter layer (166) is characterized by a semiconducting band gap that sets a short wavelength boundary on a pass band of radiation wavelengths to be detected by the photodiode array.

3. The avalanche photodiode detector of claim 1 wherein the substrate (12) comprises InP and the cross-talk spectral filter layer (166) comprises an InGaAsP alloy.

4. The avalanche photodiode detector of claim 3 wherein the semiconducting input radiation absorber layer (154) comprises an InGaAsP alloy.

5. The avalanche photodiode detector of claim 1 wherein the photodiode structures (14) comprise mesa structures including a semiconducting input radiation absorber layer (154) and a semiconducting avalanche multiplier layer (158).

6. The avalanche photodiode detector of claim 1 further comprising a microlens array (30) disposed at a position relative to the substrate to focus external input radiation to the photodiodes (14).

7. The avalanche photodiode detector of claim 6 wherein the microlens array (30) is disposed on the optical interface surface (51) of the substrate.

8. The avalanche photodiode detector of claim 1 further comprising electrical connections (42) from the substrate (12) for connecting to photodiode control and read out circuitry.

9. The avalanche photodiode detector of claim 1 further comprising at least one cross-talk blocking layer (60) comprising a plane of a blanket layer of material, disposed on the optical interface surface (51) of the substrate (12), that allows external input radiation to reach photodiodes (14) through the blanket layer of material and that attenuates radiation in the substrate that is produced by photodiodes in the array.

10. The avalanche photodiode detector of claim 1 further comprising at least one cross-talk blocking layer (60) comprising a plane of a continuous blanket layer of material including a pattern of apertures (62) positioned for allowing external input radiation to reach photodiodes (14) through the blanket layer of material and including a plane of continuous material regions (64) positioned for attenuating radiation in the substrate (12) that is produced by the avalanche photodiodes in the array.

11. The avalanche photodiode detector of claim 10 wherein the at least one cross-talk blocking layer (60) comprises at least one cross-talk blocking surface layer disposed on the optical interface surface (51) of the substrate.

* * * * *